United States Patent
Wada et al.

(10) Patent No.: US 6,677,676 B1
(45) Date of Patent: Jan. 13, 2004

(54) SEMICONDUCTOR DEVICE HAVING STEADY SUBSTRATE POTENTIAL

(75) Inventors: Yoshiki Wada, Tokyo (JP); Kimio Ueda, Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/433,382

(22) Filed: Nov. 3, 1999

(30) Foreign Application Priority Data

May 11, 1999 (JP) .......................................... 11-129467

(51) Int. Cl.$^7$ .............................................. H01L 23/48
(52) U.S. Cl. ...................... 257/734; 257/347; 257/506; 257/758; 257/773
(58) Field of Search ................................ 257/734, 758, 257/773, 347, 353, 354, 506–508

(56) References Cited

U.S. PATENT DOCUMENTS

| | | | | |
|---|---|---|---|---|
| 5,569,621 A | * | 10/1996 | Yallup et al. ................ | 438/404 |
| 5,889,306 A | * | 3/1999 | Christensen et al. ......... | 257/350 |
| 5,926,703 A | * | 7/1999 | Yamaguchi et al. ......... | 438/163 |
| 6,121,659 A | * | 9/2000 | Christensen et al. ......... | 257/347 |
| 6,150,694 A | * | 11/2000 | Tihanyi ........................ | 257/335 |

FOREIGN PATENT DOCUMENTS

| | | | | |
|---|---|---|---|---|
| JP | 3-272176 | 12/1991 | | |
| JP | 4-343265 | 11/1992 | | |
| JP | 9-45789 | 2/1997 | | |
| JP | 9-223802 | 8/1997 | | |
| JP | 9-223802 A | * | 8/1997 | ......... H01L/29/786 |

OTHER PUBLICATIONS

"Threshold Voltage of Thin–Film Silicon–on–Insulator (SOI) MOSFET's", H. Lim et al., IEEE Transactions on Electron Devices, vol. ED–30, No. 10, Oct. 1983, pp. 1244–1251.

* cited by examiner

*Primary Examiner*—Eddie Lee
*Assistant Examiner*—Matthew E. Warren
(74) *Attorney, Agent, or Firm*—McDermott, Will & Emery

(57) ABSTRACT

A semiconductor device having an SOI structure having a contact for making steady the potential of a semiconductor substrate without involvement of an increase in the surface of the semiconductor device. In a semiconductor chip, an integrated circuit is fabricated within an internal circuit region, and a plurality of buffer circuits are fabricated within buffer regions. Wiring layers for supplying steady potential are formed in the area of the semiconductor chip other than the internal circuit region and the buffer regions; for example, at four corners of the semiconductor chip, and contacts for connecting the wiring layers and the semiconductor substrate are formed in the area of the integrated circuit which is not assigned for fabrication of integrated circuits, thus eliminating a necessity for ensuring a location specifically allocated for formation of the contacts.

14 Claims, 16 Drawing Sheets

2: internal circuit region
3: electrode pad
4: buffer region

22: first interlayer insulation film
23: opening 6a, 6b: contact

24: second interlayer insulation film

62: first interlayer insulation film

SEMICONDUCTOR DEVICE HAVING STEADY SUBSTRATE POTENTIAL

BACKGROUND OF THE INVENTION

1. Field of the Invention

The present invention relates to a semiconductor device having a silicon-on-insulator (hereinafter referred to simply as "SOI") structure, a method of manufacturing the semiconductor device, and a method of manufacturing a wafer having a SOI structure for use in the semiconductor device.

2. Description of Related Art

Conventionally, an insulation layer is formed on a semiconductor substrate, and semiconductor elements, such as MOS transistors, are fabricated on the insulation layer, thus manufacturing a semiconductor device having what is called a SOI structure. If a semiconductor substrate is in an electrically floating state, electric charges stored in the substrate cannot flow away, and therefore cause changes in the potential of the substrate. This in turn causes the threshold voltage of the MOS transistor to deviate from a desired voltage. To prevent such a deviation from the desired voltage, the potential of the semiconductor substrate must be locked to a steady potential.

To this end, Japanese Patent Application Laid-Open Nos. Hei-3-272176 and Hei-9-223802 propose a semiconductor device, in which contacts are formed so as to extend from a wiring layer to a semiconductor substrate by penetrating through a insulation layer, and a steady potential is supplied to the semiconductor substrate by way of the contacts.

However, according to these prior-art techniques, a contact is formed in an element isolation region between two MOS transistors. More specifically, the contact is formed in an integrated circuit fabricated in the semiconductor device. For this reason, a location for forming a contact must be ensured in the integrated circuit, which may result in an increase in the surface area of the semiconductor device.

Provided that a contact is formed in the integrated circuit, if the contact only connects the semiconductor substrate to the wiring layer as in the case of the prior-art techniques, the number of contacts may increase, which would cause an increase in the surface area of the semiconductor device.

SUMMARY OF THE INVENTION

Therefore, the object of the present invention is to provide a semiconductor device in which there is avoided an increase in the surface area, which would otherwise be caused by forming contacts for making the potential of a silicon substrate steady.

Another object of the present invention is to provide the structure of a semiconductor device which prevents an increase in the number of contacts.

Still another object of the present invention is to provide a method of manufacturing a semiconductor device at reduced costs by arranging a process of forming contacts for making the potential of a silicon substrate steady.

Yet another object of the present invention is to provide a method of readily manufacturing a semiconductor wafer which comprises a high-concentration semiconductor layer formed on a semiconductor substrate remaining in contact with an embedded insulation film.

According to a first aspect of the present invention, there is provided a semiconductor device comprising: a semiconductor substrate; an embedded insulation film formed on one main surface of the semiconductor substrate; an integrated circuit fabricated in a first region on the surface of the embedded insulation film; an interlayer insulation film formed on the embedded insulation film so as to cover the integrated circuit; a wiring layer which includes a portion located outside the first region on the surface of the embedded insulation film, which is formed on the interlayer insulation film, and supplies steady potential; and a contact which is formed at a portion of the wiring layer outside the first region so as to extend to the semiconductor substrate by penetrating through the embedded insulation film and which establishes electrical connection between the wiring layer and the semiconductor substrate.

According to a second aspect of the present invention, there is provided a semiconductor device comprising: a semiconductor substrate; an embedded insulation film formed on one main surface of the semiconductor substrate; an integrated circuit fabricated on the embedded insulation film; an interlayer insulation film formed on the embedded insulation film so as to cover the integrated circuit; an electrode pad which is formed on the interlayer insulation film so as to be located at a position outside the region on the surface of the embedded insulation film, where an integrated circuit is fabricated; and a contact which is formed so as to extend from the lower surface of the electrode pad to the semiconductor substrate by penetrating through the embedded insulation film and which establishes electrical connection between the semiconductor substrate and the electrode pad.

According to a third aspect of the present invention, there is provided a semiconductor device comprising: a semiconductor substrate; an embedded insulation film formed on one main surface of the semiconductor substrate; a MOS transistor fabricated on the surface of the embedded insulation film; an interlayer insulation film formed so as to cover the MOS transistor; a wiring layer which is formed within the interlayer insulation film and supplies steady potential; and a contact having a portion which adjoins a region serving as one terminal of the MOS transistor in side surface, which is formed so as to extend from the wiring layer to the semiconductor substrate by penetrating through the embedded insulation film.

The above and other objects, effects, features and advantages of the present invention will become more apparent from the following description of the embodiments thereof taken in conjunction with the accompanying drawings.

BRIEF DESCRIPTION OF THE DRAWINGS

FIG. 6 is a top view showing in detail an area of the semiconductor chip 1 in the vicinity of the electrode pad 3a that receives a steady voltage; i.e., a supply voltage, and the buffer region 4a.

DETAILED DESCRIPTION OF THE PREFERRED EMBODIMENTS

Figure 1:
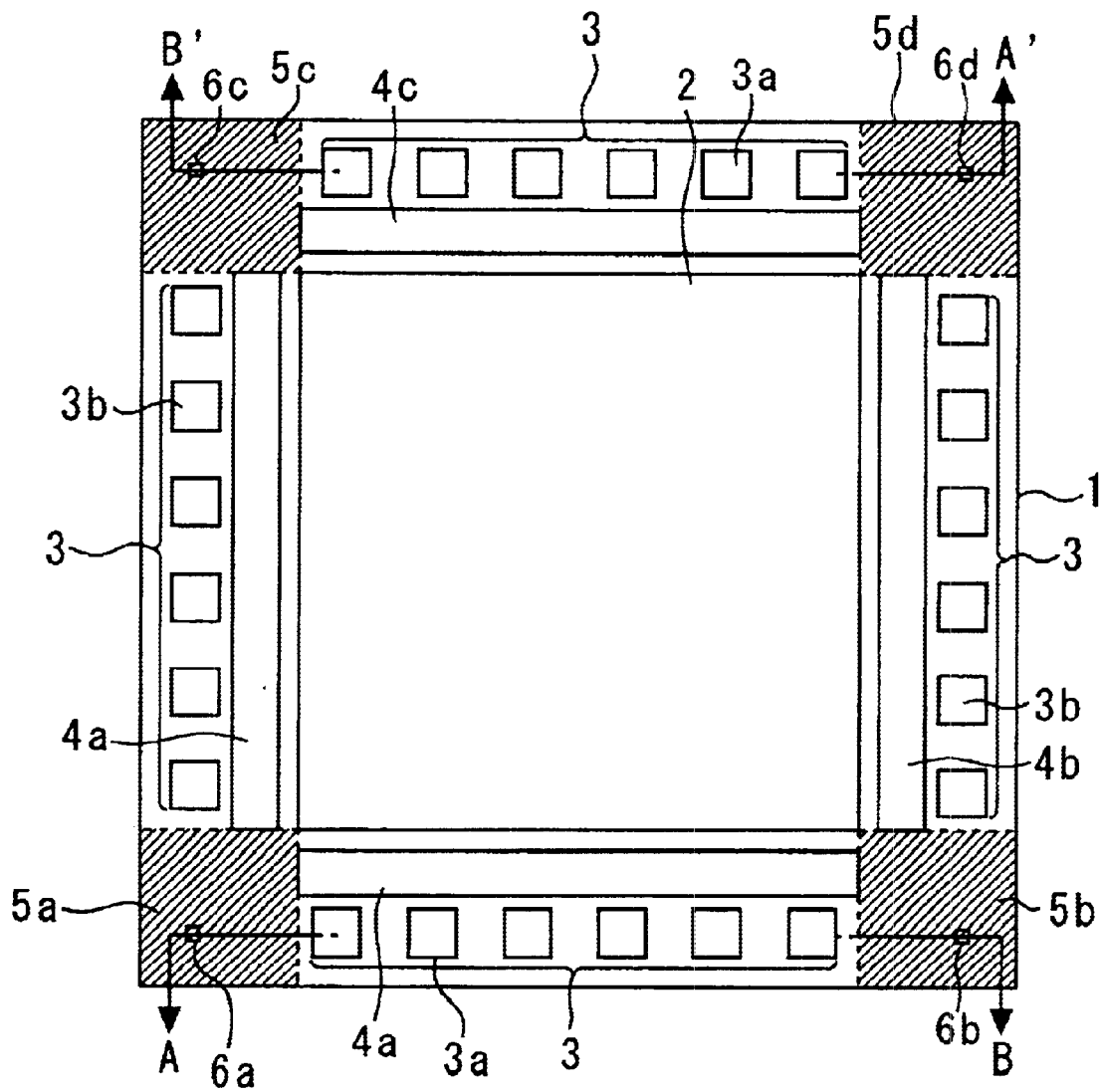
FIG. 1 is a top view of the semiconductor chip 1.

Embodiments of the present invention will be described below with reference to the accompanying drawings. It is noted that the same reference symbols in the drawings denote the same or corresponding components.

Embodiment 1

A semiconductor chip 1 serving as a semiconductor device according to a embodiment 1 will be described by reference to FIGS. 1 and 2.

FIG. 1 is a top view of the semiconductor chip 1, showing the positional relationship among integrated circuits, buffer circuits, and electrode pads of the semiconductor chip 1. The semiconductor chip 1 comprises a rectangular or square internal circuit region 2, at the center of which an integrated circuit is formed; a plurality of electrode pads 3 linearly arranged along the respective sides of the internal circuit region 2; and buffer regions 4a to 4d which are provided, so as to oppose the respective sides of the internal circuit region 2, in the areas between the internal circuit region 2 and the plurality of electrode pads 3.

The semiconductor chip 1 is packaged in resin, and a plurality of outer leads provided in the package are connected to the plurality of electrode pads 3 by way of bonding wires. A plurality of electrode pads 3 (six electrode pads are shown in FIG. 1) are arranged along each of the sides of the semiconductor chip 1. The plurality of electrode pads 3 comprise one or more pads 3a for receiving a steady potential; that is, a supply voltage, and pads 3b for receiving another steady potential; that is, a ground potential of 0V, which is lower than the supply voltage. In the drawing, a total of four pads 3a and 3b are included in each of the four rows of electrode pads 3 arranged along the respective sides of the internal circuit region 2.

An integrated circuit is also formed in each of the buffer regions 4a to 4d; a plurality of buffer circuits are arranged along, so as to oppose, the side of the internal circuit region 2. Each of the buffer circuits comprises an even number of inverter circuits connected in series and establishes electrical connection between one of the electrode pads 3, which are arranged along the same side of the internal circuit region 2 as are the buffer circuits, and the integrated circuit mounted in the internal circuit region 2. In response to an input signal, the buffer circuits drive an output signal. Here, the four electrode pads 3a and 3b are not connected to the buffer circuits and are usually connected directly to the integrated circuit.

The semiconductor chip 1 further comprises four regions 5a to 5d located at the respective corners thereof and contacts 6a to 6d which are formed in the respective four regions 5a to 5d and are connected to the semiconductor substrate in order to feed a steady potential. The regions 5a to 5d are formed at the respective vertices of the internal circuit region 2. Each of the regions 5a to 5d is defined by a first line which is an extension of one of two sides meeting at the vertex at right angles, a second line which is an extension of the remaining one of the two sides, and the edges of the semiconductor chip 1.

Figure 2:
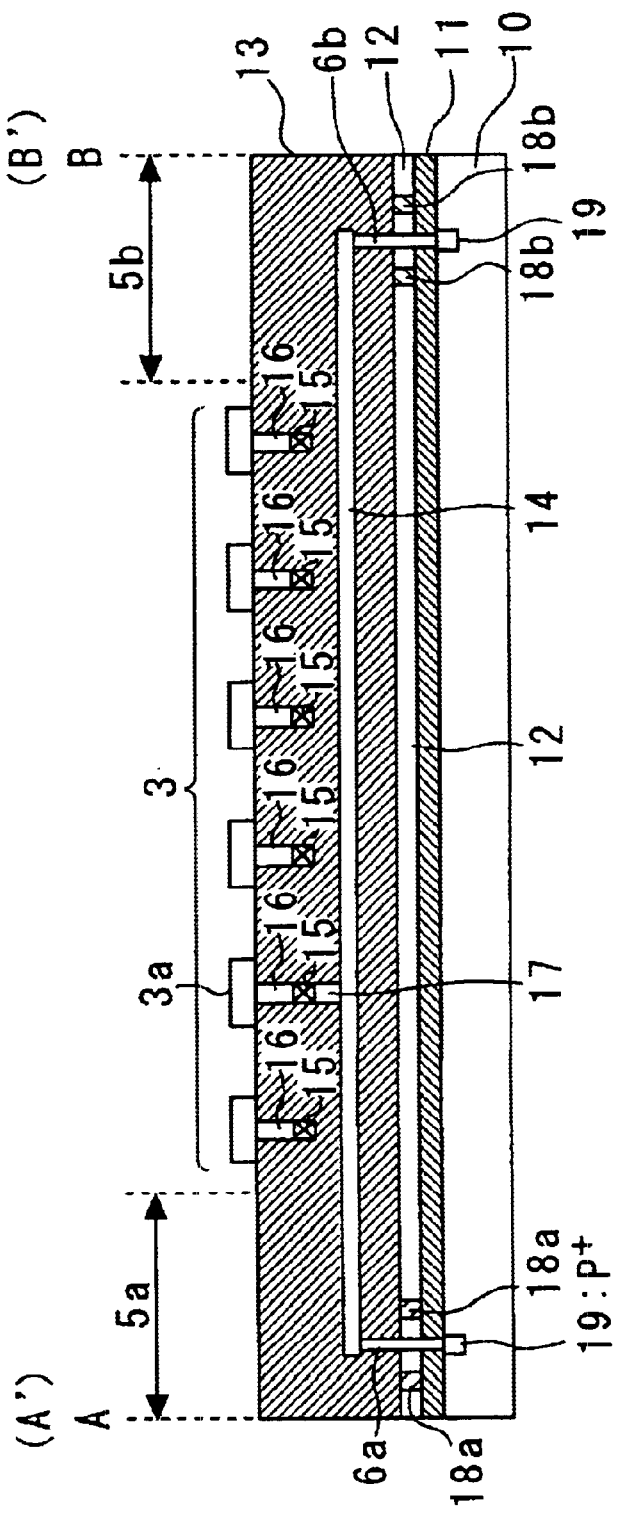
FIG. 2 is a cross-sectional view taken along line A–B shown in FIG. 1.

FIG. 2 is a cross-sectional view taken along line A–B shown in FIG. 1. The semiconductor chip 1 is a semiconductor device having an SOI structure and comprises an embedded insulation film 11 formed on the main surface of a semiconductor substrate 10; an integrated circuit including semiconductor elements, such as transistors, fabricated on the embedded insulation film 11; and an interlayer insulation film 13 formed so as to cover the integrated circuit. The embedded insulation film 11 comprising $SiO_2$ is formed on the main surface of the p-type semiconductor substrate 10, and a p-type semiconductor layer (SOI layer) 12 is formed on the embedded insulation film 11. Further, the interlayer insulation film 13 is formed on a semiconductor layer 12. An integrated circuit fabricated in the internal circuit region 2 and the buffer circuits fabricated in the buffer regions 4a and 4d are formed from FETs (field-effect transistors) comprising source-drain regions formed in the same layer as the semiconductor layer 12, and a gate electrode formed in the interlayer insulation film 13.

A first wiring layer 14 is formed within the interlayer insulation film 13. A plurality of second wiring layers 15 are formed within the interlayer insulation film 13 so as to be located above the first wiring layer 14, as well as to extend toward the internal circuit region 2. The contacts 6a and 6b are formed in the interlayer insulation film 13 so as to establish electrical connection between the first wiring layer 14 and the semiconductor substrate 10 by penetrating through the semiconductor layer 12 and the embedded insulation film 11. A $P^+$ region 19 containing impurities at higher concentration than in the semiconductor substrate 10 is formed in each of the areas of the semiconductor substrate 10 to which the contacts 6a and 6b are extended, thereby reducing the resistance of a plane along which the semiconductor substrate 10 and the contacts 6a and 6b are bonded together.

A plurality of contacts 16 are formed in the interlayer insulation film 13 so as to establish electrical contact between the electrode pads 3 and second wiring layers 15. By way of the second wiring layer 15, electrical connection is established between the electrode pads 3 and the integrated circuit fabricated in the internal circuit region 2. A contact 17 is formed in the interlayer insulation film 13 and located below the electrode pad 3a so as to establish electrical connection between the first wiring layer 14 and the second wiring layer 15 located below the electrode pad 3a.

By virtue of the foregoing configuration, the supply voltage fed to the electrode pad 3a is supplied to the semiconductor substrate 10 by way of the first wiring layer 14 and the contacts 6a and 6b. Since the potential of the semiconductor substrate 10 is maintained at the supply voltage, the threshold voltage of the MOS transistors fabricated on the embedded insulation film 11 is also maintained. Further, the P$^+$ region 19 facilitates maintaining of the potential of the semiconductor substrate 10.

Insulation layers 18a and 18b are formed in the same layer as the semiconductor layer 12 so as to assume an annular shape when viewed from the top; the insulation layer 18a surrounds the contact 6a, and the insulation layer 18b surrounds the contact 6b. The insulation layer 18a electrically isolates the portion of the semiconductor layer 12 remaining in contact with the contact 6a from the remaining portion, and the insulation layer 18b electrically isolates the portion of the semiconductor layer 12 remaining in contact with the contact 6b from the remaining portion, to thereby prevent the supply voltage from being supplied to the internal circuit region 2 and the portions of the semiconductor layer 12 located in the buffer regions 4a to 4d, by way of the contacts 6a and 6b.

A cross section which is taken along line A'–B' and includes the contacts 6c and 6d is the same in structure as that shown in FIG. 2.

No integrated circuits including transistors are formed in the four regions 5a to 5d. Contacts for supplying a steady potential to the semiconductor substrate are formed by utilization of originally-unassigned regions of the semiconductor chip, thus preventing an increase in the area of the semiconductor chip.

As shown in FIG. 1, each of the contacts 6a to 6d is formed at a position where a row of electrode pads in one direction and another row of electrode pads in another direction meet at right angles. So long as the contacts 6a to 6d are formed within the respective regions 5a to 5d, the positions of the contacts 6a to 6d within the regions 5a to 5d are not particularly limited.

In principle, the only requirement is that at least one contact communicating with the semiconductor substrate 10 be formed in at least one of the four regions 5a to 5d. As shown in FIG. 1, in order to maintain the semiconductor substrate 10 at a steady, uniform potential desirably at least one contact hole communicating with the semiconductor substrate 10 is formed in each of the four regions 5a to 5d.

Further, there is no necessity for limiting to the supply voltage the steady potential supplied to the semiconductor substrate 10 by way of the contacts 6a to 6d; a ground potential applied to the electrode pads 3b may also be used as a steady potential supplied to the semiconductor substrate 10. In either case, the layout of the first wiring layer connected to the contacts 6a to 6d is changed, and a steady potential is supplied to the semiconductor substrate 10 by way of the first wiring layer 14.

The first wiring layer 14 is formed linearly below the row of electrode pads 3 shown in FIG. 2 so as to become longitudinally aligned with the row of electrode pads 3. The area below of the wiring layer 14 is also originally unassigned for fabrication of integrated circuits. Therefore, contacts communicating with the semiconductor substrate 10 may be formed at arbitrary locations below the wiring layer 14 so as to penetrate through the embedded insulation film 11, and insulation layers like the insulation layers 18a and 18b may be formed so as to surround the thus-formed contacts.

A method of manufacturing the semiconductor chip 1, which includes process steps (1) through (7) to be described later, will now be described by reference to FIG. 3.

Figure 3A:
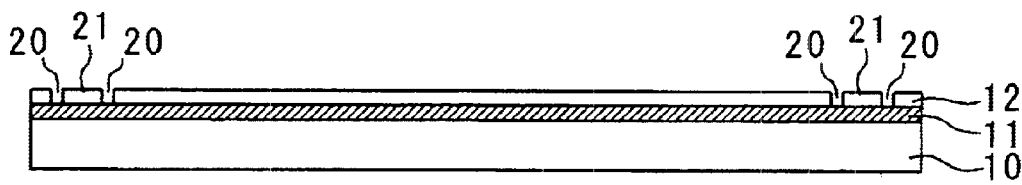
FIGS. 3A to 3D show a method of manufacturing the semiconductor chip 1.

Process step (1): As shown in FIG. 3a, there is prepared a wafer comprising a p-type semiconductor substrate 10, an embedded insulation film 11 formed on the semiconductor substrate 10, and a p-type semiconductor layer 12 formed on the embedded insulation film 11. Openings 20 are formed in the respective regions 5a to 5d by selectively etching the semiconductor layer 12, thereby separating portions 21 of the semiconductor layer 12 from the remaining portion of the same. Further, MOS transistors comprising integrated circuits formed on the embedded insulation film 11 are fabricated in the internal circuit region 2 and the buffer regions 4a to 4d.

Figure 3B:
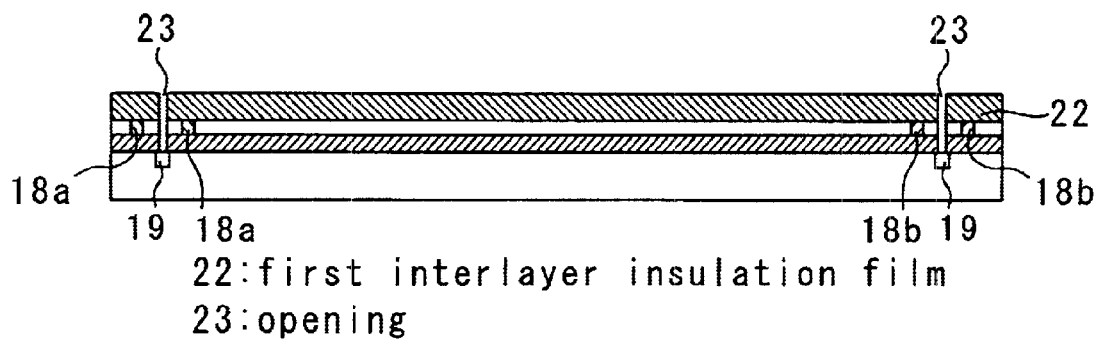

Process step (2): As shown in FIG. 3B, a first insulation film 22 is formed on the semiconductor layer 12 through use of the CVD method. At this time, the openings 20 are also filled with insulation material, thus forming the insulation layers 18a and 18b.

Process step (3): Openings 23 are formed so as to communicate with the semiconductor substrate 10 by penetrating through the first interlayer insulation film 22, the semiconductor layer 12, and the embedded insulation film 11. After formation of the openings 23, P$^+$ ions are implanted into the semiconductor substrate 10 through the openings 23, thereby constituting the P$^+$ regions 19.

Figure 3C:
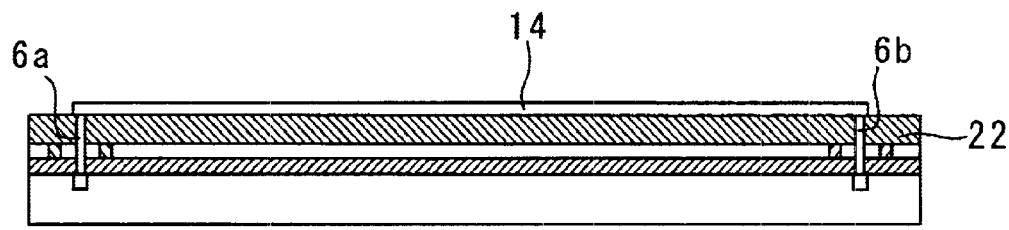

Process step (4): As shown in FIG. 3C, the contacts 6a and 6b are formed from metal, such as tungsten, in the respective openings 23. Further, the first wiring layer 14 is formed from metal, such as aluminum, on the first interlayer insulation film 22.

Figure 3D:
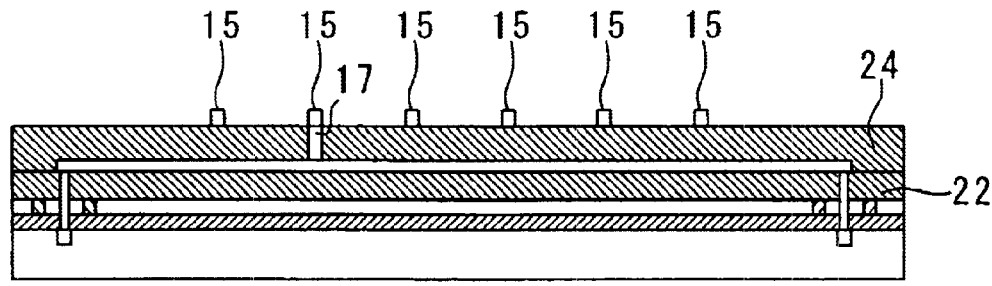

Process step (5): As shown in FIG. 3d, a second interlayer insulation film 24 is formed on both the first wiring layer 14 and the first interlayer insulation film 22. Subsequently, an opening communicating with the first wiring layer 14 is formed in the second interlayer insulation film 24, and the contact 17 is formed from metal, such as aluminum, in the opening. Further, a plurality of second wiring layers 15 are formed from metal, such as aluminum, on the second interlayer insulation film 24. One of the plurality of second wiring layers 15 is formed so as to be connected to the contact 17.

Process step (6): A third interlayer insulation film is formed so as to cover the second interlayer insulation film 24 and the plurality of second wiring layers 15. The first interlayer insulation film 22 to the third interlayer insulation film constitute the interlayer insulation film 13 shown in FIG. 2.

Process step (7): A plurality of openings communicating with the respective second wiring layers 15 are formed in the third interlayer insulation film, and the contacts 16 are formed from metal, such as aluminum, in the openings. Subsequently, the electrode pads 3 communicating with the respective contacts 16 are formed.

In the previously-described processing steps, etching technique is used for forming the openings, and lithography and etching techniques are used for pattering the wiring layers. Further, CVD is used for forming the wiring layers, the interlayer insulation film, and the contacts.

Embodiment 2

Figure 4:
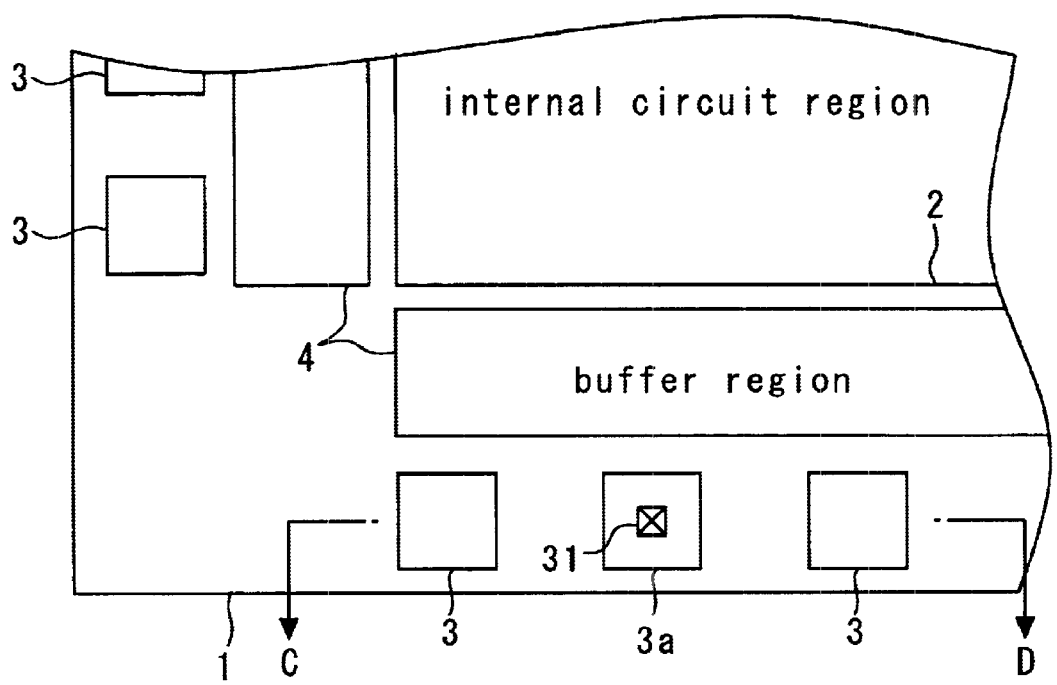
FIG. 4 is a top view showing an area of the semiconductor chip 1 in the vicinity of the electrode pad 3a that receives a steady voltage; i.e., a supply voltage.

The semiconductor chip 1 serving as a semiconductor device according to a embodiment 2 will next be described by reference to FIGS. 4 and 5. The semiconductor chip 1 according to the embodiment 2 is identical with that shown in FIG. 1, in terms of the positional relationship among the integrated circuits integrated in the semiconductor chip, the plurality of electrode pads including pads for receiving a supply voltage and pads for receiving a ground voltage, and the plurality of buffer circuits connecting the integrated circuits to the electrode pads. FIG. 4 is a top view showing an area of the semiconductor chip 1 in the vicinity of the electrode pad 3a that receives a steady voltage; i.e., a supply voltage.

Figure 5:
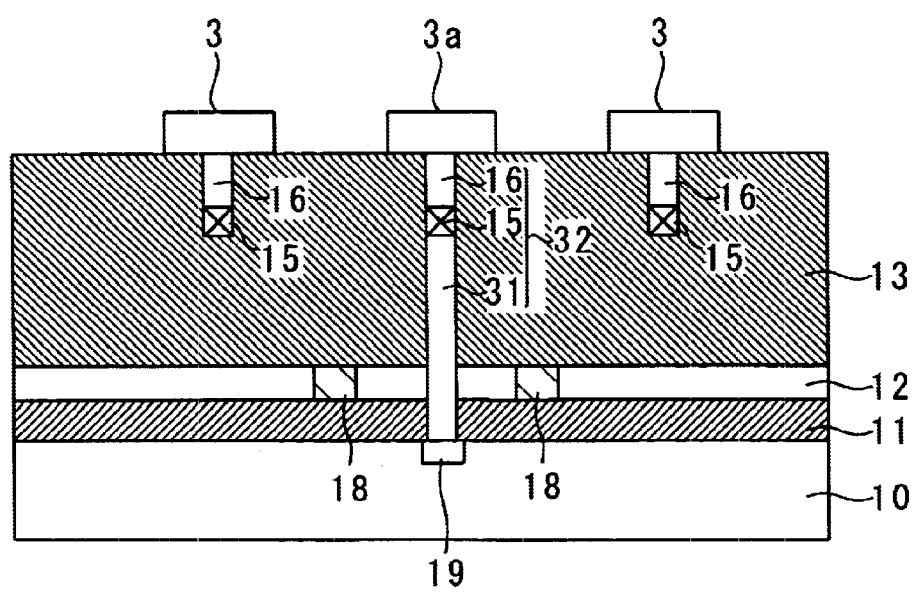
FIG. 5 is a cross-sectional view taken along line C–D shown in FIG. 4.

FIG. 5 is a cross-sectional view taken along line C–D shown in FIG. 4. As shown in FIG. 5, a contact 31 is formed directly below an electrode pad 3a of the contact 31 so as to extend vertically from the second wiring layer 15 to the semiconductor substrate 10 by penetrating through the embedded insulation film 11. The contact 16, the second wiring layer 15, and the contact 31 constitute a single contact 32 formed between the electrode pad 3a and the semiconductor substrate 10. Consequently, electrical connection is established between the electrode pad 3a and the semiconductor substrate 10 by way of the second wiring layer 15 and the contact 31, whereby a supply voltage is supplied to the semiconductor substrate 10.

As in the case of the embodiment 1, the P$^+$ region 19 that contains impurities at a higher concentration than in the semiconductor substrate 10 is formed in the area of the semiconductor substrate 10 with which the contact 31 communicates, thereby reducing the resistance of a plane at which the contact 31 is in contact with the semiconductor substrate 10. The insulation layer 18 is formed in the same layer as the semiconductor layer 12 so as to assume an annular shaped when viewed from the top, thus surrounding the contact 31.

No integrated circuits including transistors are usually formed directly below the electrode pads 3. Contacts for supplying steady potential to the semiconductor substrate are formed in the originally-unassigned areas of the semiconductor chip, thus eliminating a necessity for increasing the area of the semiconductor chip.

So long as a contact is formed directly below the electrode pad 3b so as to connect the electrode pad 3b to the semiconductor substrate 10, in place of the supply voltage a ground potential may be supplied to the semiconductor substrate 10.

A method of manufacturing the semiconductor chip 1 shown in FIG. 1 will now be described. This method comprises process steps (11) to (16).

Process step (11): Identical with process step (1), except that the openings 20 and the semiconductor layer 12 are formed at different positions than in process step (1).

Process step (12): The first interlayer insulation film 22 is formed on the semiconductor layer 12. Simultaneously, the openings 20 are also filled with insulation material, thus forming the insulation layer 18. Further, the first wiring layer 14 is formed in an unillustrated area of the first interlayer insulation film 22.

Process step (13): The second interlayer insulation film 24 is formed so as to cover the first wiring layer 14 and the first interlayer insulation film 22. Subsequently, openings 23 are formed in the surface of the second interlayer insulation film 22 so as to communicate with the semiconductor substrate 10 by penetrating through the semiconductor layer 12 and the embedded insulation film 11. After formation of the openings 23, P$^+$ ions are implanted into the semiconductor substrate 10 through the openings 23, thereby constituting the P$^+$ regions 19.

Process step (14): The contact 31 is formed by filling the inside of the openings 23 with metal, such as tungsten, thus constituting the contacts 31. The plurality of second wiring layers 15 are formed from metal, such as aluminum, on the second interlayer insulation film 24.

Process step (15): Identical with process step (6)

Process step (16): Identical with process step (7)

As in the case of the embodiment 1, in the previously-described process steps, etching technique is used for forming the openings, and lithography and etching techniques are used for patterning the wiring layers. Further, CVD is used for forming the wiring layers, the interlayer insulation film, and the contacts.

In place of the contact 31, another contact may be formed below the electrode pad 3a so as to communicate with the semiconductor substrate 10 by penetrating through the embedded insulation film 11. Consequently, a total of two contacts; i.e., the thus-formed contact and the contact 16, are formed below the electrode pad 3a. In this case, process step (13) for forming the opening 23 becomes unnecessary, and openings are formed in process step (16) so as to extend from the third interlayer insulation film to the semiconductor substrate 10. The openings are filled with metal.

Embodiment 3

Figure 6:
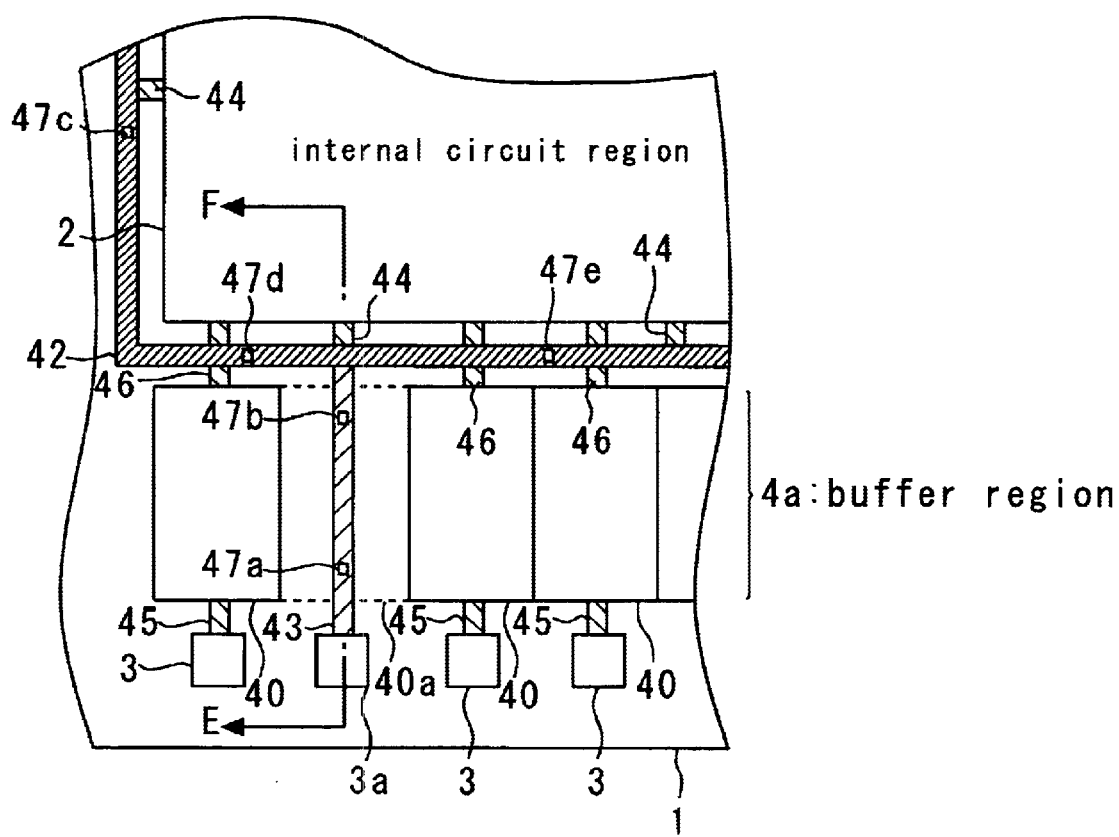

The semiconductor chip 1 serving as a semiconductor device according to a embodiment 3 will next be described by reference to FIGS. 6 and 7. The semiconductor chip 1 according to the embodiment 3 is identical with that shown in FIG. 1, in terms of the positional relationship among the integrated circuits integrated in the semiconductor chip, the plurality of electrode pads including pads for receiving a supply voltage and pads for receiving a ground voltage, and the plurality of buffer circuits connecting the integrated circuits to the electrode pads. FIG. 6 is a top view showing in detail an area of the semiconductor chip 1 in the vicinity of the electrode pad 3a that receives a steady voltage; i.e., a supply voltage, and the buffer region 4a.

The electrode pad 3a is connected, by way of the second wiring layer 15, to the integrated circuit fabricated in an internal circuit region 2 and supplies the supply voltage to the integrated circuit.

The buffer regions 4a to 4d are provided opposite the respective rows of electrode pads 3, and each of the buffer regions 4a to 4d comprises a plurality of buffer formation regions 40 arranged along the side of the internal circuit region 2. A buffer circuit is formed in each of the buffer formation regions 40 arranged opposite the electrode pads 3 other than the electrode pad 3a. The buffer circuits are connected to the electrode pads 3 by way of a first wiring layer 45 and are connected to the integrated circuit fabricated in the internal circuit region 2 by way of a first wiring layer 46. The first wiring layers 45 and 46 are formed below a second wiring layer within the interlayer insulation film 13.

A buffer formation region 40a opposite the electrode pad 3a is a dummy region where no buffer circuit is formed. The condition of no buffer circuit existing in the dummy region includes a case where a buffer circuit per se does not exist in the dummy region and a case where source regions, drain regions, and gate electrodes of a plurality of MOS transistors to be included in a buffer circuit are formed but fail to operate as a buffer circuit.

The second wiring layer connected to the electrode pad 3a comprises an annular portion 42 which is interposed between the internal circuit region 2 and the four buffer regions 4a to 4d shown in FIG. 1 so as to surround the internal circuit region 2; a linear portion 43 for connecting the electrode pad 3a to the annular portion 42; and a plurality of linear portions 44 for connecting the annular portion 42 to the internal circuit region 2.

In the embodiment 3, a plurality of contacts 47a to 47e are formed below the second wiring layer so as to penetrate through the embedded insulation film 11 and to connect the second wiring layer to the semiconductor substrate 10. Particularly, the contacts 47a and 47b are formed below the linear portion 43 of the second wiring layer within the buffer formation region 40a, and the contacts 47c to 47e are formed below the annular portion 42 of the second wiring layer.

Figure 7:
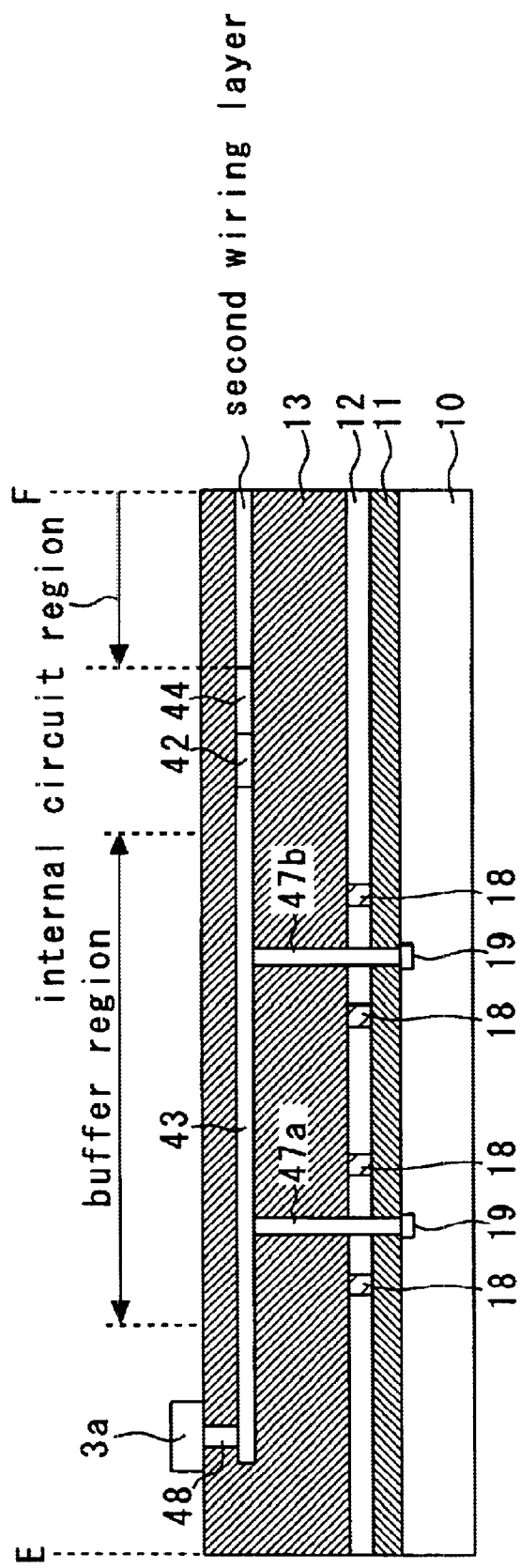
FIG. 7 shows a cross-sectional view taken along line E–F shown in FIG. 6.

FIG. 7 shows a cross-sectional view taken along line E–F shown in FIG. 6.

The second wiring layer is formed within the interlayer insulation film 13. The contacts 47a and 47b are formed so as to extend from the linear portion 43 of the second wiring layer to the semiconductor substrate 10 by penetrating through the semiconductor layer 12 and the embedded insulation film 11, thereby establishing electrical connection between the second wiring layer and the semiconductor substrate 10. The annular insulation layer 18 is formed in the same layer as the semiconductor layer 12 so as to surround the contacts 47a and 47b. Further, a contact 48 is formed below the electrode pad 3a so as to extend to the linear portion 43 of the second wiring layer, thus establishing electrical connection between the electrode pad 3a and the second wiring layer.

The contacts 47c to 47e shown in FIG. 6 are also formed so as to extend from the annular portion 42 of the second wiring layer to the semiconductor substrate 10 by penetrating through the semiconductor layer 12 and the embedded film 11, thereby establishing electrical connection between the second wiring layer and the semiconductor substrate 10. As in the case of the insulation film 18, the annular insulation layers 18 surrounding the respective contacts 47c to 47e are formed in the same layer as the semiconductor layer 12.

Usually, no integrated circuits are fabricated in the area outside the internal circuit region 2 and below the second wiring layer which supplies steady potential from the electrode pad 3a to the internal circuit region 2. As mentioned previously, the contacts 47a to 47e for supplying steady potential to the semiconductor substrate 10 are formed in the originally-unassigned regions of the semiconductor chip, thereby preventing an increase in the area of the semiconductor chip.

Particularly, since neither buffer circuits nor other circuits are formed in the buffer formation region 40a, contacts can be formed below one of the areas where buffer circuits are arranged in a side-by-side configuration (i.e., an area corresponding to the buffer formation region 40a), as in the case of the contacts 47a and 47b.

Contacts may be formed at an arbitrary location within the buffer formation regions 40.

The second wiring layer may be formed so as to divide the linear portion 43 into branches within the buffer formation region 40a, and contacts may be formed below respective branches so as to penetrate through the embedded insulation film 11 to the semiconductor substrate 10.

Contacts shown in FIG. 7 and communicating with the semiconductor substrate 10 may be formed below the linear portions 44 of the second wiring layer. Further, the first wiring layers 45 and 46 provided in the interlayer insulation film 13 may be connected to the semiconductor substrate 10 by way of the contact. Further, the electrode pad 3a may supply not a supply voltage but a ground potential to the integrated circuit.

A method of manufacturing the semiconductor chip shown in FIG. 7 will now be described. This manufacturing method comprises the following process steps (21) through (27).

Process step (21): Identical with process step (1), except that the openings 20 and the semiconductor layer 12 are formed at different positions than in process step (1).

Process step (22): The first interlayer insulation film 22 is formed on the semiconductor layer 12. Simultaneously, the openings 20 are also filled with insulation material, thus forming the insulation layer 18. Further, the plurality of first wiring layers 45 and 46 are formed on the first interlayer insulation film 22.

Process step (23): The second interlayer insulation film 24 is formed so as to cover the first wiring layers 45 and 46 and the first interlayer insulation film 22. Subsequently, openings 23 are formed in the surface of the second interlayer insulation film 22 so as to communicate with the semiconductor substrate 10 by penetrating through the second interlayer insulation film 24, the semiconductor layer 12, and the embedded insulation film 11. After formation of the openings 23, P+ ions are implanted into the semiconductor substrate 10 through the openings 23, thereby constituting the P+ regions 19.

Process step (24): The contacts 47a to 47e are formed by filling the inside of the openings 23 with metal, such as tungsten. Further, the second wiring layer (comprising portions 42 to 44) is formed from metal, such as aluminum, on the second interlayer insulation film 24.

Process step (25): The third interlayer insulation film is formed so as to cover the second interlayer insulation film 24 and the second wiring layer.

Process step (26): Openings are formed in the third interlayer insulation film so as to communicate with the second wiring layer.

Process step (27): The contacts 48 are formed by filling the openings with metal, such as aluminum, and the electrode pads 3a are formed so as to be connected to the respective contacts 48.

As in the case of the embodiment 1, in the previously-described process steps, etching technique is used for forming the openings, and lithography and etching techniques are used for patterning the wiring layers. Further, CVD is used for forming the wiring layers, the interlayer insulation film, and the contacts.

As has been described, in the first embodiment, the semiconductor chip 1 comprises a wiring layer for supplying steady potential to an area other than the internal circuit region 2, where an integrated circuit is fabricated, and the buffer region 4a; and contacts which are formed in an area of the wiring layer outside the internal circuit region 2 and the buffer region 4a so as to penetrate through the embedded insulation film 11 to the semiconductor substrate 10. Contacts for supplying steady potential to the semiconductor substrate 10 are formed in the area of the semiconductor chip unassigned for fabrication of semiconductor circuits, thus preventing an increase in the area of the semiconductor chip, which would otherwise be caused by fabrication of the contacts.

Embodiment 4

Figure 8:
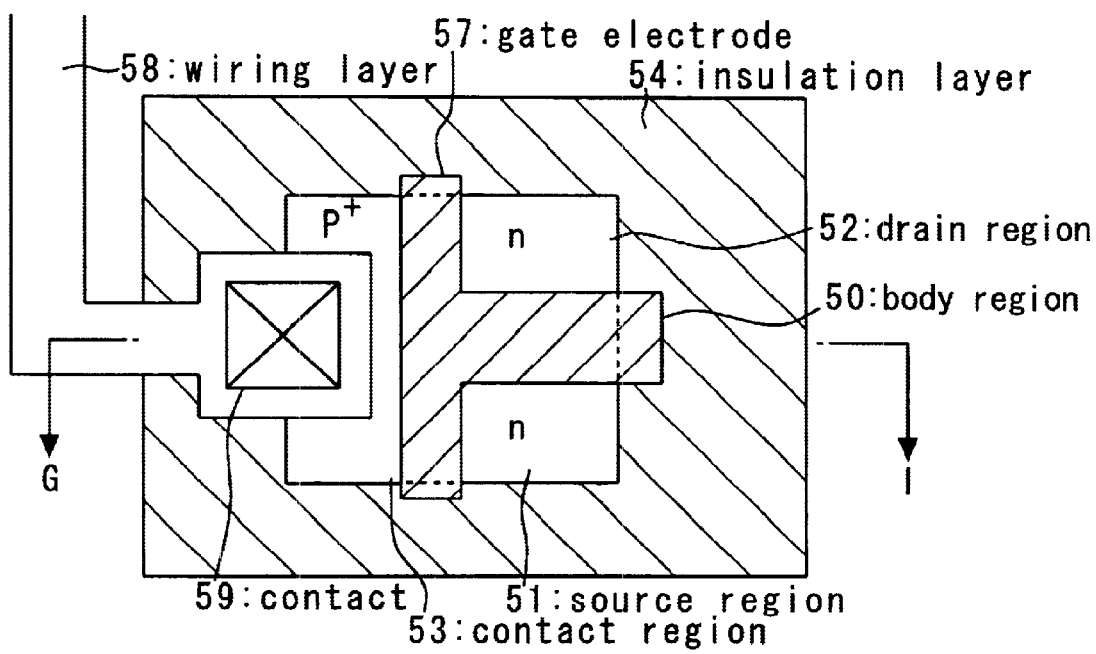
FIG. 8 is a top view showing a MOS transistor fabricated on the semiconductor chip.
Figure 9:
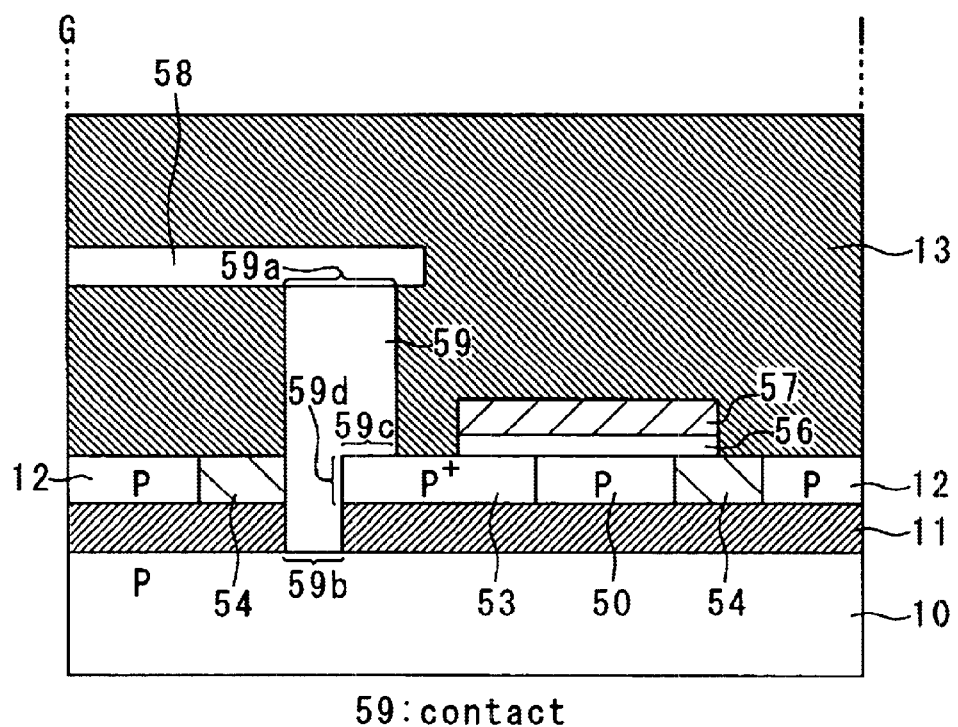
FIG. 9 is a cross-sectional view taken along line G–H shown in FIG. 8.

A semiconductor chip serving as a semiconductor device according to a embodiment 4 will next be described by reference to FIGS. 8 and 9. FIG. 8 is a top view showing a MOS transistor fabricated on the semiconductor chip, and FIG. 9 is a cross-sectional view taken along line G–H shown in FIG. 8. The embodiment 4 is directed toward a semiconductor chip having such a structure as to supply steady potential from a wiring layer 58 to a body region 50 of the MOS transistor and to supply the steady potential further to the semiconductor substrate 10.

As shown in the drawings, the semiconductor layer 12 is formed on the embedded insulation film 11 and comprises a body region 50 serving as a p-type semiconductor layer; a source region 51 and a drain region 52 which are spaced from each other by means of the body region 50 existing therebetween and which serve as n-type semiconductor layers; and a contact region 53 which is electrically connected to the body region 50 and serves as a p-type semiconductor layer. A insulation layer 54 adjoining the semiconductor layer 12 is formed on the embedded insulation film 11 and surrounds the body region 50, the source region 51, the drain region 52, and the contact region 53.

A gate electrode 57 is formed on the semiconductor layer 12 with a gate oxide film 56 interposed therebetween. The gate electrode 57 has a T-shaped profile, and an overlap exists between a lateral portion of the T-shaped gate electrode 57 and a portion of the contact region 53. Further, an overlap exists between a longitudinal portion of the T-shaped gate electrode 57 and the entirety of the body region 50. The three ends of the T-shaped gate electrode 57 are extended up to the insulation layer 54. A single MOS transistor is constituted by combination of the body region 50, the source region 51, the drain region 52, and the gate electrode 54.

The interlayer insulation film 13 is formed on the source region 51, the drain region 52, the contact region 53, the insulation layer 54, the gate electrode 57, and the semiconductor layer 12.

The wiring layer 58 is formed within the interlayer insulation film 13 and supplies steady potential. In the case of an n-type MOS transistor, steady potential corresponds to a ground potential. In contrast, in the case of a p-type MOS transistor, steady potential corresponds to a supply voltage. The MOS transistor has a typical structure for permitting flow of electric charges opposite to those of carriers resulting from impact ionization in the body region 50. A contact 59 is formed within the interlayer insulation film 13 so as to extend vertically from the lower surface of the wiring layer 58 to the semiconductor substrate 10 by penetrating through the embedded insulation film 11. Further, a portion of the contact 59 adjoins the end of the contact region 53. More specifically, the contact 59 has four contact planes; a first contact plane 59a adjoining the lower surface of the wiring layer 58 at right angles in the vertical direction; a second plane 59b provided opposite the first contact plane 59a and adjoining the main surface of the semiconductor substrate 10; a third contact plane 59c provided opposite the first contact plane 59a and adjoining the upper surface of the contact region 53; and a fourth contact plane 59d which is a portion of the vertical side surface of the contact 59 and adjoins the side surface of the contact region 53. By virtue of the above-described structure of the contact 59, steady potential is supplied to the body region 50 and the semiconductor substrate 10 of the MOS transistor by way of the contact 59.

The contact 59 serves as both a contact for supplying steady potential and a contact for supplying steady potential to the body region 50 of the MOS transistor, thereby enabling a reduction in the number of contacts and preventing an increase in the area of the semiconductor chip.

A method of manufacturing the semiconductor chip will next be described by reference to FIG. 10 and an example in which an n-type MOS transistor is fabricated as a transistor shown in FIG. 8. This manufacturing method comprises the following process steps (31) through (36).

Figure 10A:
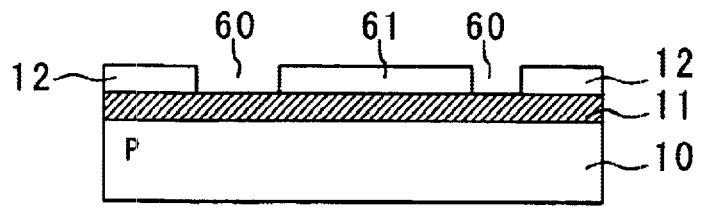
FIGS. 10A to 10E show a method of manufacturing the semiconductor chip.

Process step (31): As shown in FIG. 10A, there is prepared a wafer comprising a p-type semiconductor substrate 10, an embedded insulation film 11 formed on the semiconductor substrate 10, and a p-type semiconductor layer 12 formed on the embedded insulation film 11. An opening 60 is formed so as to assume an annular shape when viewed from the top, by selectively etching away the semiconductor layer 12. A rectangular semiconductor layer 61 is left within the opening 60. Two sections of the opening 60 are shown in the cross-sectional view shown in FIG. 10, and one of the two sections of the opening 60 is made so as to become wider than the other section. The reason for this is that a portion of a insulation layer filling the wider section of the opening 60 is etched away in a subsequence process and the thus-removed insulation layer must be compensated for.

Figure 10B:
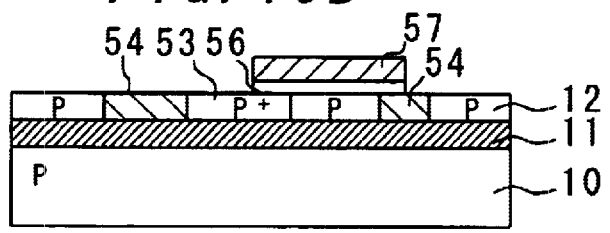

Process step (32): As shown in FIG. 10B, a insulation layer 54 is formed by filling the inside of the opening 60 with $SiO_2$. Subsequently, after the wafer has been subjected to predetermined masking treatment, n-type ions are implanted or diffused into the semiconductor layer 61, thus forming the source region 51 and the drain region 52, which are made to oppose each other with a distance therebetween. The area of the semiconductor layer 61 in which ntype ions are not implanted or diffused is formed into the p-type contact region 53 and the p-type body region 52. Alternatively, after the wafer has been subjected to predetermined masking treatment, the contact region 53 may be formed by implanting p+ions into the semiconductor layer 61. In this case, the impurities contained in the contact region 53 become higher in concentration than those contained in the body region 52, thereby establishing good electrical connection between the contact 59 and the body region 52.

Process step (33): The gate oxide film 56 is formed so as to extend across the body region 50, the contact region 53, and the insulation layer 54, and the gate electrode 57 is formed on the gate oxide film 56.

Figure 10C:
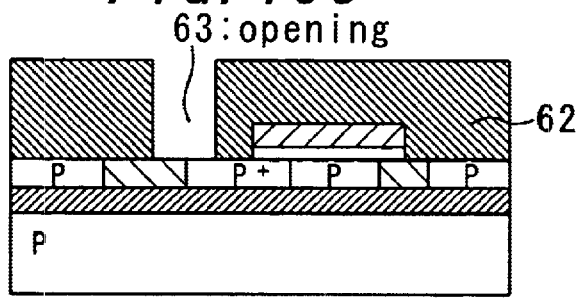

Process step (34): As shown in FIG. 10C, after formation of a first interlayer insulation film 62, an opening 63 is formed by means of etching at a position where the cross section of the opening 63 includes a boundary surface between the insulation layer 54 and the contact region 53. In connection with this etching, etchant which selectively etches only insulation material is used.

Figure 10D:
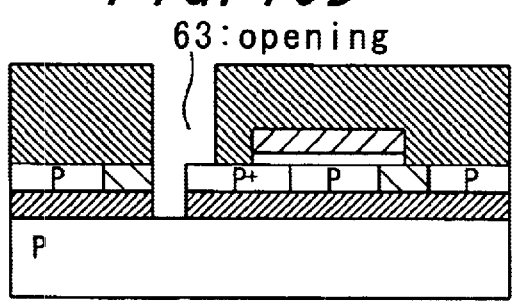

Etching is continued even after a portion of the insulation layer 54 and a portion of the contact region 53 have been exposed within the opening 63. As shown in FIG. 10D, etching is continued until the semiconductor substrate 10 becomes exposed within the opening 63. During the etching process, the contact region 53 formed from semiconductor material is not etched away at all.

Figure 10E:
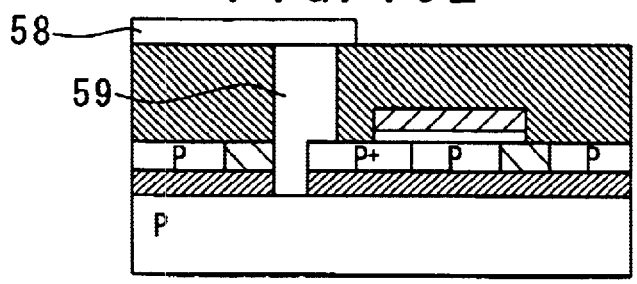

Process step (35): As shown in FIG. 10E, the contact 59 is formed by filling the inside of the opening 63 with metal, such as tungsten. Further, the wiring layer 58 is formed from metal, such as aluminum, on the first interlayer insulation film 62 so as to connect with the contact 59.

Process step (36): A second interlayer insulation film is formed so as to cover the first interlayer insulation film 62 and the wiring layer 58, and a second wiring layer is formed on the second interlayer insulation film, thus constituting a multi-layered structure.

In the previously-described process steps, etching technique is used for forming the openings, and lithography and etching techniques are used for patterning the wiring layers. Further, CVD is used for forming the wiring layers, the interlayer insulation film, and the contacts.

According to this manufacturing method, the opening 63 for use in forming the contact 59 is formed at the position where the cross-section of the opening 63 includes a boundary surface between the insulation layer 54 and the contact region 53. The semiconductor substrate 10 and the contact region 53 can be exposed by etching the wafer through use of a single mask and etchant which selectively eliminates only a insulation material, thereby eliminating a necessity for use of a plurality of types of etchant and use of a plurality of masks and reducing costs incurred by manufacture of a semiconductor chip.

The contact 59 formed according to the foregoing manufacturing method is structured so as to be connected to the contact region 53 by way of the third contact plane 59c and the fourth contact plane 59d, with the result that the area of the contact plane between the contact 59 and the contact region 53 becomes greater. Accordingly, good electrical contact is established between the contact 59 and the body region 50 by way of the contact region 53.

Figure 11A:
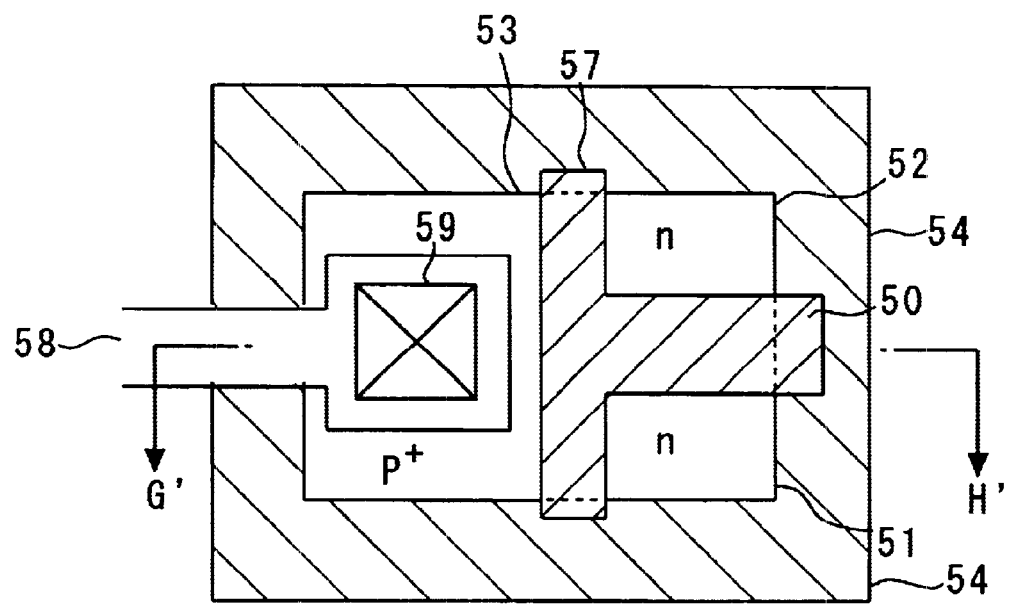
FIGS. 11A and 11B show a modification of the embodiment 4.
Figure 11B:
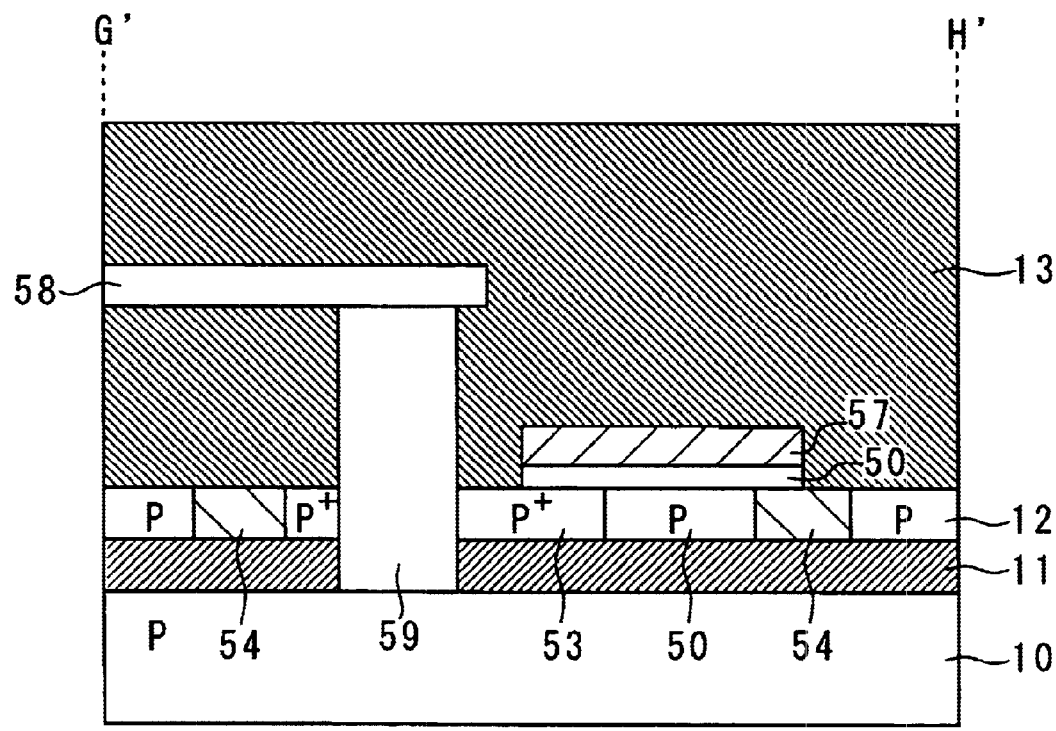

FIGS. 11A and 11B show a modification of the embodiment 4; FIG. 11A is a top view of the modification, and FIG. 11B is a cross-sectional view taken along line G'–H'. This modification differs from the embodiment shown in FIGS. 8 and 9 in that the contact 59 is provided in the contact region 53. In this case, an opening to be filled with the contact 59 is provided so as to penetrate through the contact region 53. The circumferential surface of the contact 59 is surrounded by and connected to the contact region 53.

Under the method of manufacturing a semiconductor chip according to this modification, although only a single mask is used in process step (33), the opening must be formed through the process steps of: eliminating a portion of the first interlayer insulation film 62 through selective etching of insulation material while the contact region 53 is used as a stopper; eliminating a portion of the contact region 53 through selective etching of semiconductor material while the embedded insulation film 11 is used as a stopper; and eliminating a portion of the embedded insulation film 11 by selective etching of insulation material while the semiconductor substrate 10 is used as a stopper. Alternatively, the wafer may be etched through use of etchant which eliminates both insulation material and semiconductor material, and etching may be stopped before the opening reaches the semiconductor substrate 10.

Embodiment 5

Figure 12:
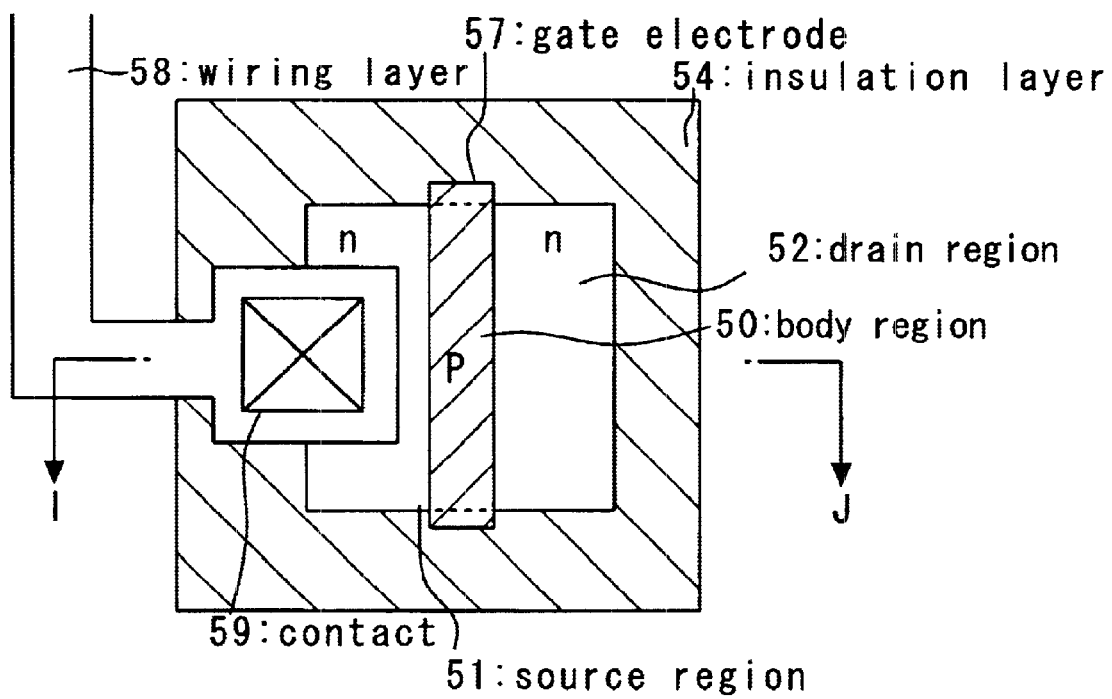
FIG. 12 is a top view showing a MOS transistor fabricated on the semiconductor chip.
Figure 13:
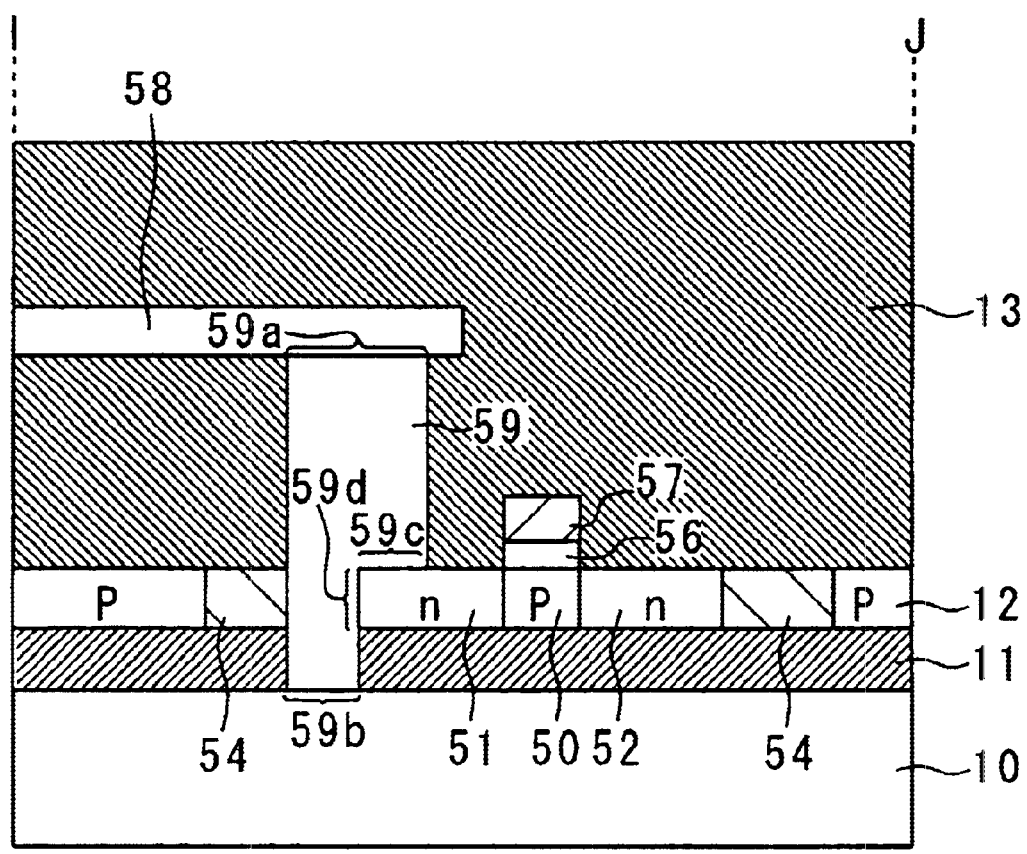
FIG. 13 is a cross-sectional view taken along line I–J shown in FIG. 12.

A semiconductor chip serving as a semiconductor device according to a embodiment 5 of the present invention will now be described by reference to FIGS. 12 and 13, wherein FIG. 12 is a top view showing a MOS transistor fabricated on the semiconductor chip, and FIG. 13 is a cross-sectional view taken along line I–J shown in FIG. 12. The embodiment 5 shows the configuration of the semiconductor chip, in which steady potential is supplied to the source region 51 of the MOS transistor from the wiring layer 58 and is also supplied to the semiconductor substrate 10.

As shown in the drawing, the semiconductor chip does not include the contact region 53 shown in FIG. 8, and the insulation layer 54 is formed so as to surround the source region 51, the drain region 52, and the body region 50 sandwiched between the source region 51 and the drain region 52. An overlap exists between the gate electrode 57 and the body region 50, and the respective longitudinal ends of the gate electrode 57 are extended up to the insulation layer 54.

In the case of an n-type MOS transistor, the steady potential supplied to the source region 51 by means of the wiring layer 58 corresponds to a ground potential GND. In contrast, in the case of a p-type MOS transistor, the steady potential corresponds to a supply voltage VDD. These voltages are commonly employed in various types of logic circuits such as inverters, NAND circuits, and NOR circuits. The contact 59 is formed within the interlayer insulation film 13 so as to vertically extend from the lower surface of the wiring layer 58 to the semiconductor substrate 10 by penetrating through the embedded oxide film 11 and is connected to the edge of the source region 51. More specifically, the contact 59 has four contact planes; namely, the first contact plane 59a adjoining the lower surface of the wiring layer 58; the second plane 59b adjoining the main surface of the semiconductor substrate 10; the third contact plane 59c adjoining the upper surface of the source region 51; and the fourth contact plane 59d which is a portion of the vertical side surface of the contact 59 and adjoins the side surface of the source region 51. By virtue of the above-described structure of the contact 59, steady potential is supplied to the source region 51 and the semiconductor substrate 10 of the MOS transistor.

The contact 59 serves as both a contact for supplying steady potential and a contact for supplying steady potential to the source region 51 of the MOS transistor, thereby enabling a reduction in the number of contacts and preventing an increase in the area of the semiconductor chip.

Next, a method of manufacturing the semiconductor chip will be described by reference to an example in which an n-type MOS transistor is fabricated as a transistor shown in FIG. 12. The manufacturing method comprises the following process steps (41) through (46):

Process step (41): Identical with process step (31)

Process step (42): Identical with process step (32), except that the contact region 53 does not exist.

Process step (43): Identical with process step (33), except that the gate electrode 57 has a different geometry.

Process step (44): Identical with process step (34), where the opening 63 is formed in such a position that the cross-section of the opening 63 includes a boundary surface between the insulation layer 54 and the source region 51. The wafer is etched until a portion of the source region 51 and a portion of the semiconductor substrate 10 become exposed within the opening 63.

Process step (45): Identical with process step (35)

Process step (46): Identical with process step (36)

Even in this manufacturing method, as in the case of the embodiment 4, the opening 63 used for forming the contact 59 is formed by etching through use of a single mask and one type of etchant, thus preventing an increase in costs incurred by manufacture of a semiconductor chip. The contact 59 is connected to the source region 51 by way of the third and fourth contact planes 59c and 59d, thereby increasing the area of a contact plane between the contact 59 and the source region 51, thereby establishing good electrical connection between the contact 59 and the source region 51.

Figure 14A:
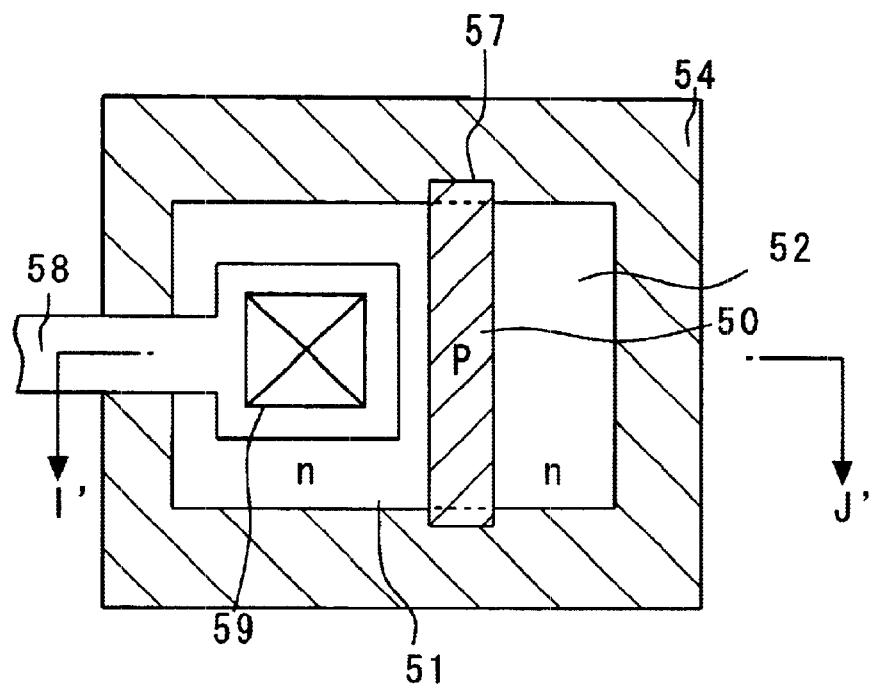
FIGS. 14A and 14B show a modification of embodiment 5.
Figure 14B:
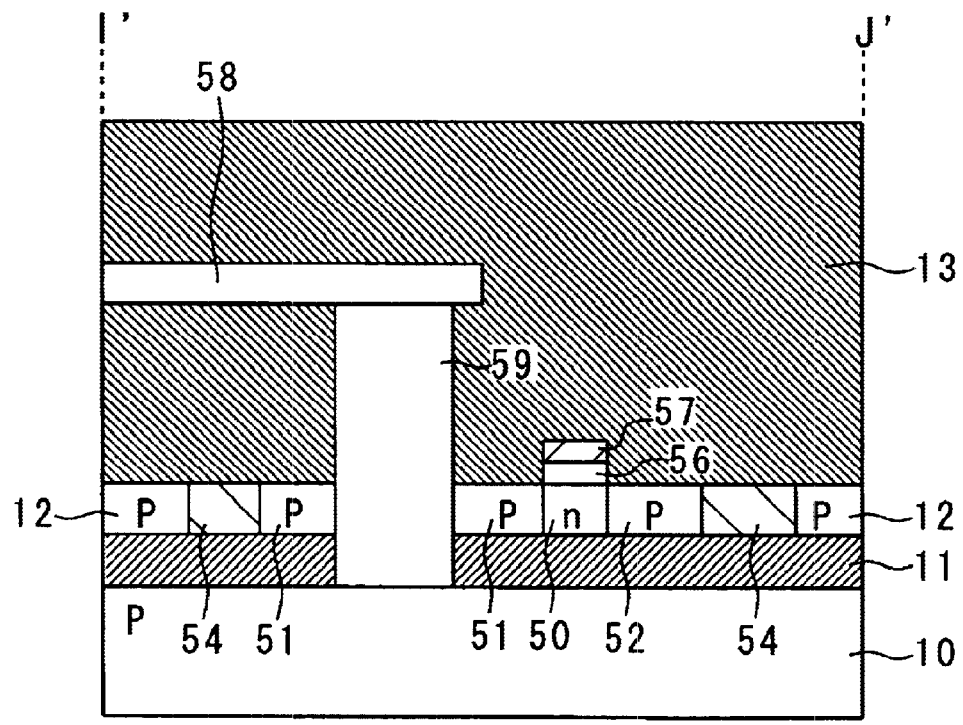

FIGS. 14A and 14B show a modification of the embodiment 5; FIG. 14A is a top view of the modification, and FIG. 14B is a cross-sectional view taken along line I'–J'. This modification differs from the embodiment shown in FIG. 12 in that the contact 59 is provided in the source region 51. In this case, an opening to be filled with the contact 59 is provided so as to penetrate through the source region 51. The circumferential surface of the contact 59 is covered with and connected to the source region 51.

Process steps for forming the opening are the same as those shown in FIG. 11.

Embodiment 6

Figure 15:
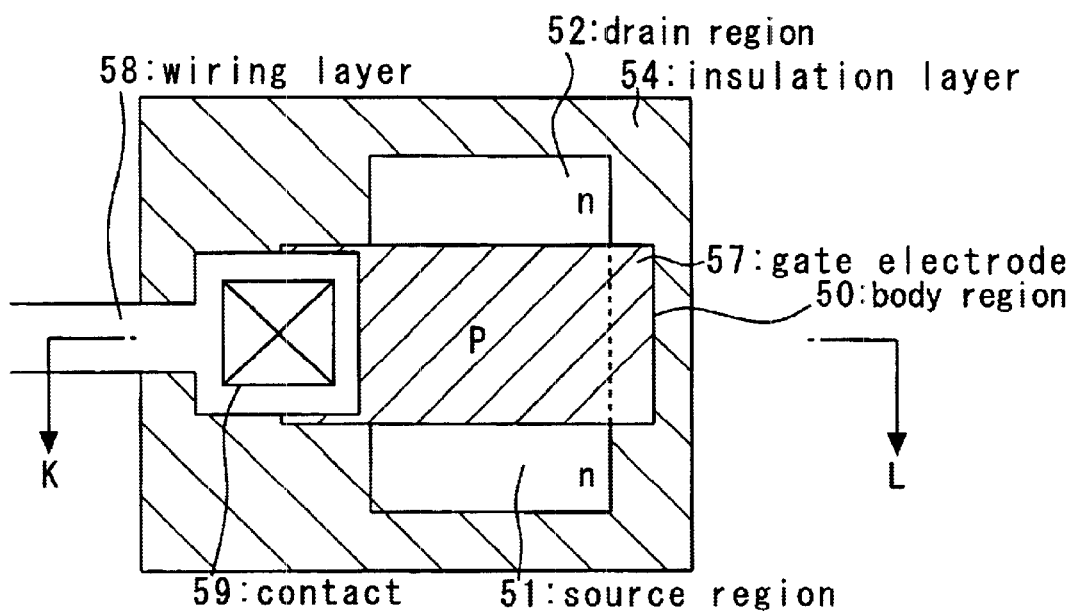
FIG. 15 is a top view showing a MOS transistor fabricated on the semiconductor chip.
Figure 16:
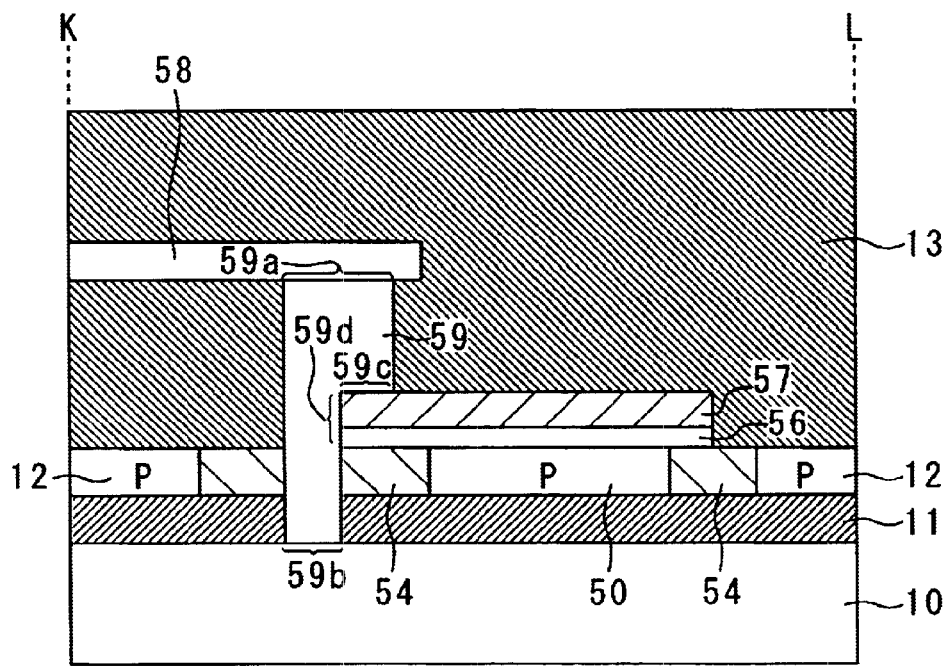
FIG. 16 is a cross-sectional view taken along line K–L shown in FIG. 15.

A semiconductor chip serving as a semiconductor device according to a embodiment 6 will next be described by reference to FIGS. 15 and 16. FIG. 15 is a top view showing a MOS transistor fabricated on the semiconductor chip, and FIG. 16 is a cross-sectional view taken along line K–L shown in FIG. 15. The embodiment 6 is directed toward a semiconductor chip having such a structure as to supply steady potential from a wiring layer 58 to the gate electrode 57 of the MOS transistor and to supply the steady potential further to the semiconductor substrate 10. Supplying steady potential to the gate electrode 57 is well known in the field of gate isolation, such as supply of steady potential observed in a gate array or a MOS transistor used as a load resistor.

In the drawing, the semiconductor chip does not include the contact region 53 shown in FIG. 8, and the insulation layer 54 is formed so as to surround the source region 51, the drain region 52, and the body region 50 sandwiched between the source region 51 and the drain region 52. An overlap exists between the gate electrode 57 and the body region 50, and the longitudinal respective ends of the gate electrode 57 are extended up to the insulation layer 54.

The contact 59 is formed within the interlayer insulation film 13 so as to vertically extend from the lower surface of the wiring layer 58 to the semiconductor substrate 10 by penetrating through the embedded oxide film 11, and is connected to the edge of the source region 51. More specifically, the contact 59 has four contact planes; namely, the first contact plane 59a adjoining the lower surface of the wiring layer 58; the second plane 59b adjoining the main surface of the semiconductor substrate 10; the third contact plane 59c adjoining the upper surface of the gate electrode 57; and the fourth contact plane 59d which is a portion of the vertical side surface of the contact 59 and adjoins the side surface of the gate electrode 57. Further, there is a requirement that the circumferential surface of the contact 59 be coated with the insulation layer 54 so as to be isolated from the body region 50. By virtue of the above-described structure of the contact 59, steady potential is supplied to the gate electrode 57 and the semiconductor substrate 10 of the MOS transistor.

The contact 59 serves as both a contact for supplying steady potential and a contact for supplying steady potential to the gate electrode 57 of the MOS transistor, thereby enabling a reduction in the number of contacts and preventing an increase in the area of the semiconductor chip.

A method of manufacturing the semiconductor chip will next be described by reference to FIGS. 19A to 19D, by reference to an example in which an n-type MOS transistor is fabricated as a transistor shown in FIG. 15. This manufacturing method comprises the following process steps (51) through (55).

Figure 19A:
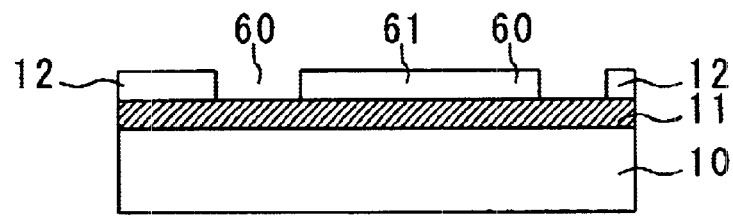
FIGS. 19A to 19D show a method of manufacturing the semiconductor chip according to embodiment 6.

Process step (51): As shown in FIG. 19A, there is prepared a wafer comprising a p-type semiconductor substrate 10, an embedded insulation film 11 formed on the semiconductor substrate 10, and a p-type semiconductor layer 12 formed on the embedded insulation film 11. An opening 60 is formed so as to assume an annular shape when viewed from the top, by selectively etching away the semiconductor layer 12. A rectangular semiconductor layer 61 is left within the opening 60. Two sections of the opening 60 are shown in the cross-sectional view shown in FIG. 19A, and one of the two sections of the opening 60 is made so as to become wider than the remaining section. The reason for this is that a portion of a insulation layer filling the wider section of the opening 60 is etched away in a subsequence process and the thus-removed insulation layer must be compensated for.

Figure 19B:
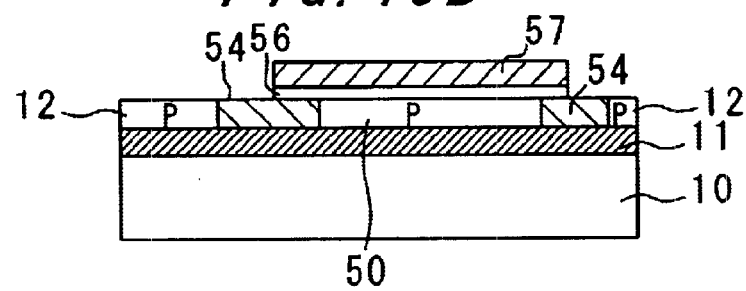

Process step (52): As shown in FIG. 19B, the insulation layer 54 is formed by filling the inside of the opening 60 with $SiO_2$. Subsequently, after the wafer has been subjected to predetermined masking treatment, n-type ions are implanted or diffused into the semiconductor layer 61, thus forming the source region 51 and the drain region 52, which oppose each other with a distance therebetween. The area of the semiconductor layer 61 in which n-type ions are not implanted or diffused is formed into the p-type body region 52. Further, the gate oxide film 56 is formed so as to extend over the body region 50 and the insulation layer 54, and the gate electrode 57 is formed on the gate oxide film 56. The respective longitudinal ends of the gate electrode 57 are linearly extended up to the insulation layer 54.

Figure 19C:
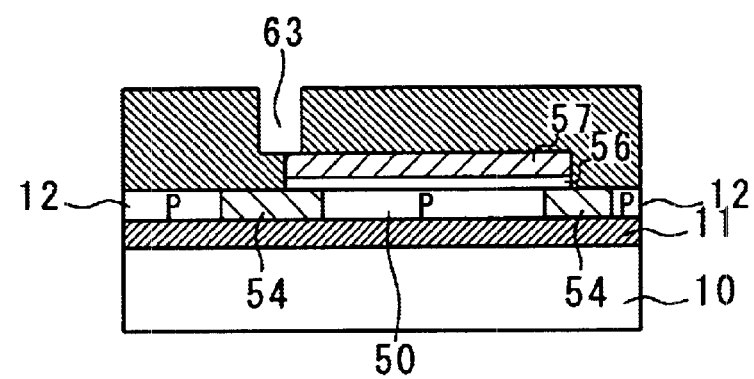
Figure 19D:
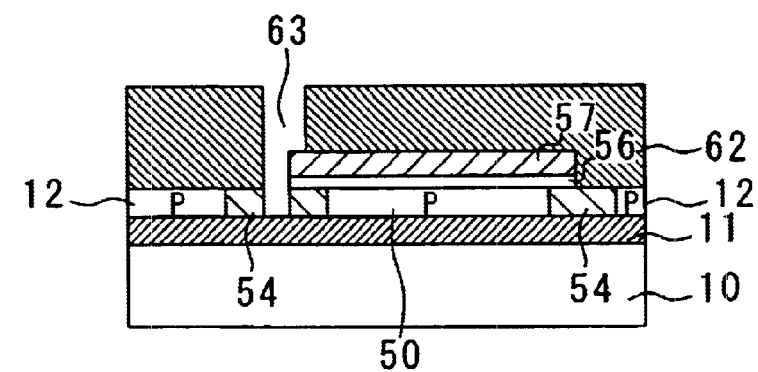

Process step (53): As shown in FIG. 19C, the first interlayer insulation film 62 is formed on the gate electrode 57, the insulation layer 54, and the semiconductor layer 12. The opening 63 is formed by means of etching at a position where the cross section of the opening 63 includes one end of the gate electrode 57. For this etching, etchant which selectively etches only insulation material is used. Etching is continued even after a portion of the gate electrode 57 has been exposed within the opening 63. As shown in FIG. 19D, etching is continued until the semiconductor substrate 10 becomes exposed within the opening 63. At this time, a portion of the exposed gate electrode 57 serves as a stopper, with the result that an area below the gate electrode 57 is prevented from being etched away. Other than the gate electrode 57, all the areas within the opening 63 down to the semiconductor substrate 10 are constituted of insulation material and, hence, are etched away.

Process step (54): As shown in FIG. 19D, the contact 59 is formed by filling the inside of the opening 63 with metal, such as tungsten. The opening 63 is formed so as to penetrate through the insulation layer 54, and hence the contact 59 is not electrically connected to the semiconductor layer 12 and the body region 50. Further, the wiring layer 58 is formed from metal, such as aluminum, on the first interlayer insulation film 62 so as to adjoin the contact 59.

Process step (55): A second interlayer insulation film is formed so as to cover the first interlayer insulation film 62 and the wiring layer 58, and the second wiring layer is formed on the second interlayer insulation film, thus constituting a multi-layered structure.

In the previously-described process steps, etching technique is used for forming the openings, and lithography and etching techniques are used for patterning the wiring layers. Further, CVD is used for forming the wiring layers, the interlayer insulation film, and the contacts.

Even according to this manufacturing method, as in the case of the embodiment 4, the opening 63 used for forming the contact 59 is etched away through use of a single mask and one type of etchant, thus preventing an increase in costs incurred by manufacture of a semiconductor chip. Further, the end of the gate electrode 57 adjoining the contact 59 is formed along the boundary surface between the body region 50 and the insulation layer 54 until it adjoins the insulation layer 54, thereby preventing the contact 59 from adjoining the body region 50. Further, the contact 59 is connected to the gate electrode 57 by way of the third contact plane 59c and the fourth contact plane 59d, thereby increasing the area of a contact plane between the contact 59 and the gate electrode 57. Accordingly, good electrical connection is established between the gate electrode 57 and the contact 59.

As in the case of the modifications shown in FIGS. 11 and 14, the contact 59 may be formed within the gate electrode 57. In this case, the opening to be filled with the contact 59 is formed so as to penetrate through the gate electrode 57. The contact 59 is connected to the gate electrode 57 such that the circumferential surface of the contact 59 is covered with the gate electrode 57.

Embodiment 7

Figure 17A:
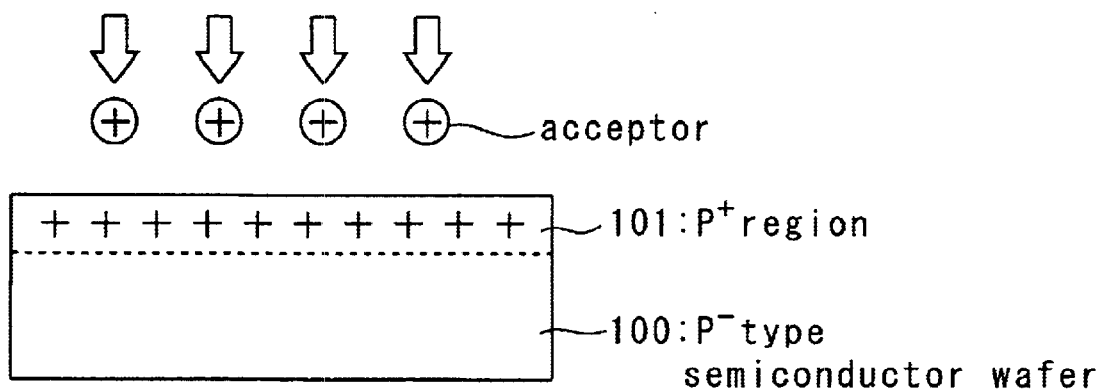
FIGS. 17A to 17C show a method of manufacturing a substrate having an SOI structure according to embodiment 7.
Figure 17B:
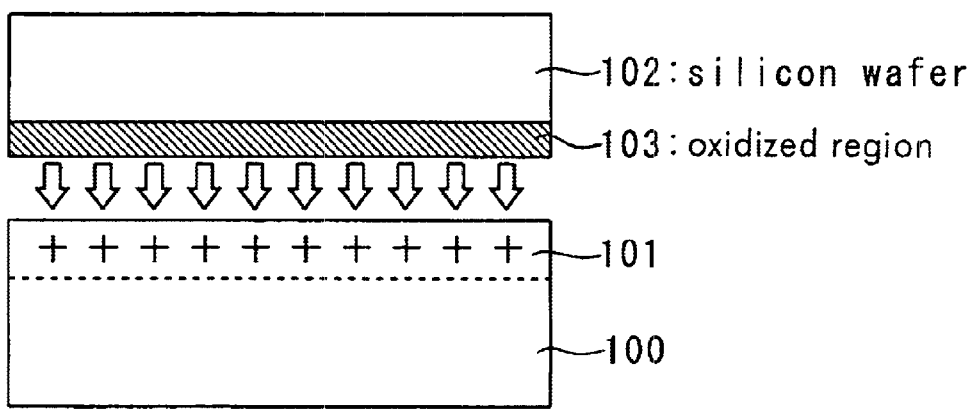
Figure 17C:
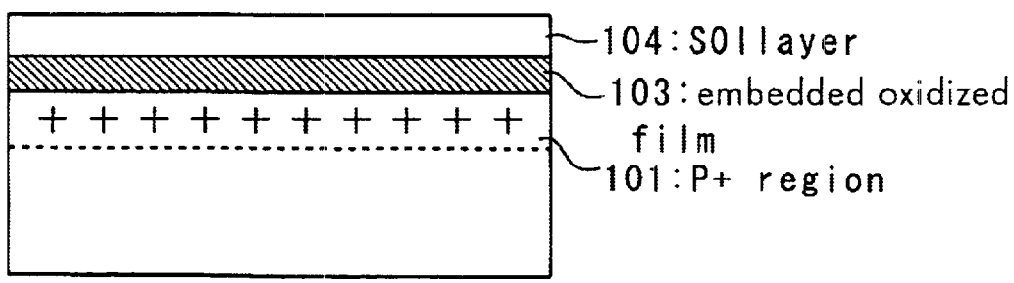

By reference to FIGS. 17A to 17C, a method of manufacturing a substrate having an SOI structure according to a embodiment 7 will now be described. This manufacturing method comprises the following process steps (61) to (63).

Process step (61): P+ ions, which are to act as acceptors, are implanted or diffused into the overall main surface of a p-type semiconductor wafer 100, to thereby form, to a predetermined depth, a region 101 which has a greater acceptor concentration than does the remaining area of the semiconductor wafer 100 (see FIG. 17A).

Process step (62): The main surface of a p-type semiconductor wafer 102 is oxidized beforehand, to thereby form an oxidized region 103 to a predetermined depth of the wafer 102. The region 101 of the wafer 100 and the oxidized region 103 of the wafer 102 are brought into close mutual contact and these wafers are annealed, thereby causing the regions 102 and 103 to adhere to each other (see FIG. 17B).

Process step (63): The wafer 102 is abraded from its reverse surface; i.e., the surface opposite the surface on which the oxidized region 103 is formed, through mechanical or chemical abrasion, thereby leaving a semiconductor layer 104 of predetermined thickness (see FIG. 17C).

The wafer thus manufactured through process steps (61) to (63) has an SOI structure. The p-type semiconductor wafer 101 corresponds to a semiconductor substrate of SOI structure; the oxidized region 103 corresponds to an embedded insulation film; and the p-type semiconductor layer 104 corresponds to a semiconductor layer.

In a semiconductor device comprising a wafer of SOI structure and an integrated circuit mounted thereon, establishing electrical connection between a semiconductor substrate and the contact penetrating through the embedded insulation film further involves process steps of: forming from a semiconductor layer a semiconductor element which is to constitute an integrated circuit and, subsequently, forming an interlayer insulation film so as to cover the semiconductor element; forming in the interlayer insulation film an opening used for forming a contact so as to penetrate through the embedded insulation film; and filling the inside of the opening with polysilicon which is to constitute the contact.

Wherever the opening is formed, the area of the semiconductor substrate whose acceptor concentration is high is opened. Accordingly, the contact adjoins the high acceptor-concentration region, thereby reducing the area of a contact plane between the semiconductor substrate and the contact. Thereby, the potential of the semiconductor substrate is readily made steady.

As in the case of the embodiment 7, Japanese Patent Application Laid-Open No. Hei-3-272176 also describes formation, on the surface of the semiconductor substrate adjoining the embedded insulation film, of a semiconductor layer which has a higher ion concentration than does the semiconductor substrate. However, as shown in FIG. 2 of Patent Application No. Hei-3-272176, since ions are implanted into the semiconductor layer from above so as to pass through the semiconductor layer and the embedded insulation film, difficult control is required for effecting distribution of semiconductor ions between the semiconductor substrate and the embedded insulation film. In contrast, according the embodiment 7, after semiconductor ions have been implanted or diffused into the surface of the silicon wafer beforehand, the silicon wafer is attached to another silicon wafer whose surface has been oxidized beforehand, thus eliminating a necessity for difficult control required for distribution of a high concentration of ions between the semiconductor substrate and the embedded insulation film. A semiconductor wafer comprising a semiconductor substrate, an embedded insulation film, and a high-impurity-concentration region is readily manufactured.

Embodiment 8

A method of manufacturing a substrate of SOI structure according to an embodiment 8 will now be described by reference to FIG. 18. This manufacturing method comprises the following process steps (71) to (73).

Figure 18A:
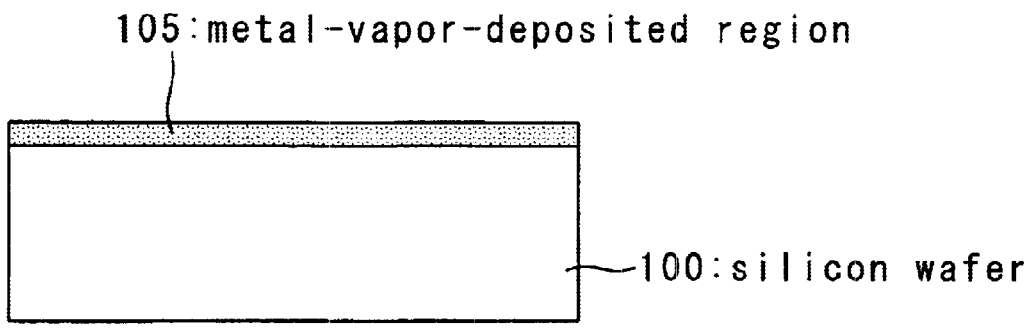
FIGS. 18A to 18C show a method of manufacturing a substrate of SOI structure according to an embodiment 8.

Process step (71): Metal, such as gold, copper, or aluminum, is vapor-deposited onto the overall main surface of the p-type semiconductor wafer 100, to thereby form a metal-vapor-deposited region 105 to a predetermined depth from the main surface of the wafer 100 (FIG. 18A).

Figure 18B:
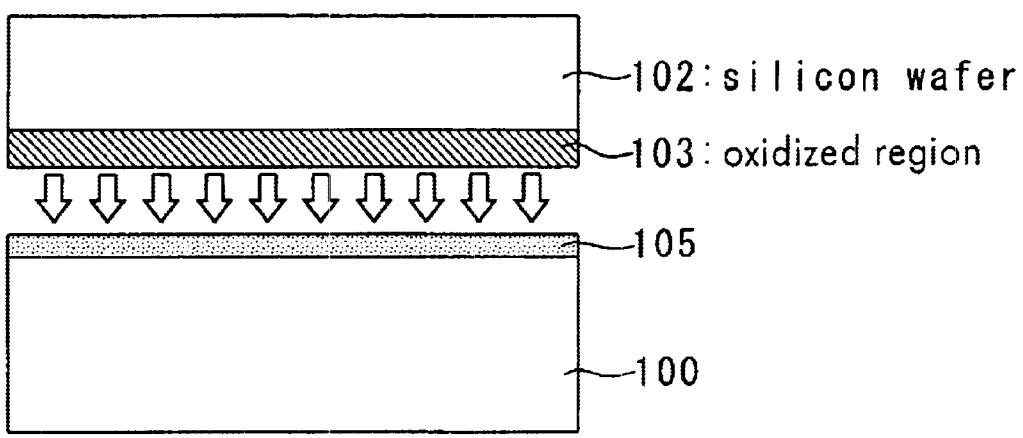
Figure 18C:
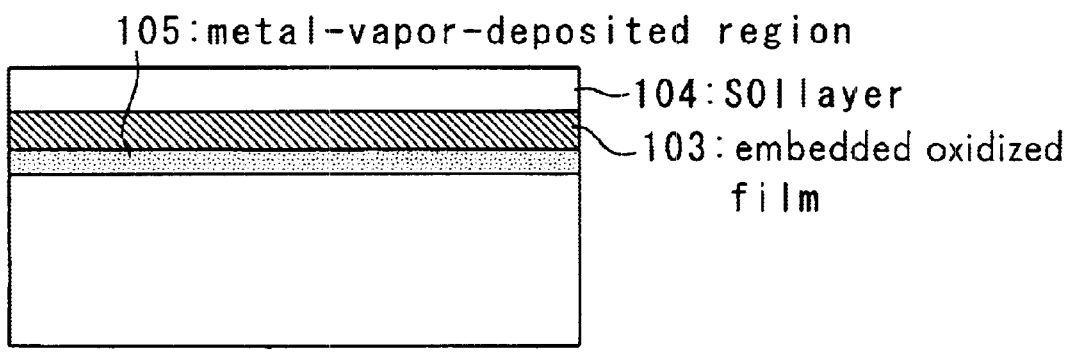

Process step (72): The main surface of the p-type semiconductor wafer 102 is oxidized beforehand, to thereby form the oxidized region 103 to a predetermined depth from the main surface in the wafer 102. The metal-vapor-deposited region 105 of the wafer 100 and the oxidized region 103 of the wafer 102 are brought into close mutual contact and annealed, thereby causing the metal-vapor-deposited region 105 to adhere to the oxidized region 103 (FIG. 18B).

Process step (73): The wafer 102 is abraded from its reverse surface; i.e., the surface opposite the surface on which the oxidized region 103 is formed, through mechanical or chemical abrasion, thereby leaving a semiconductor layer 104 of predetermined thickness (see FIG. 18C).

The wafer thus manufactured through process steps (71) to (73) has an SOI structure. The p-type semiconductor wafer 101 corresponds to a semiconductor substrate of SOI structure; the oxidized region 102 corresponds to an embedded insulation film; and the p-type semiconductor layer 104 corresponds to a semiconductor layer.

In the semiconductor device comprising an integrated circuit mounted on a wafer of SOI structure, if a contact penetrating through an embedded insulation film is electrically connected to a semiconductor substrate, process steps identical with those mentioned in connection with the embodiment 7 are performed.

Wherever the opening is formed, metal-vapor-deposited region of the semiconductor substrate is opened. Accordingly, the contact comes to adjoin the metal-vapor-deposited region, thereby reducing resistance of a contact plane between the semiconductor substrate and the contact. Thereby, the potential of the semiconductor substrate is readily made steady.

After metal has been vapor-deposited on the surface of a silicon wafer beforehand, another silicon wafer whose surface is oxidized is attached to the metal-vapor-deposited region of the silicon wafer, thereby eliminating a necessity for control required for distribution of ions between the semiconductor substrate and the embedded insulation film. A semiconductor wafer comprising a semiconductor substrate, an embedded insulation film, and a region of high impurity concentration sandwiched therebetween can be manufactured more easily than that described in Japanese Patent Application Laid-open No. Hei-3-272176.

As has been described above, in a semiconductor substrate according to the present invention, a contact for supplying steady potential to a semiconductor substrate is formed so as to extend from a wiring layer located outside a first region on the surface of an embedded insulation film, where an integrated circuit is fabricated, to the semiconductor substrate by penetrating through the embedded insulation film. The contact can be formed in a region of the semiconductor device which is originally unassigned for fabrication of an integrated circuit, thus preventing an increase in the area of the semiconductor device.

In the semiconductor device according to the present invention, provided that boundaries of a first region comprise a first line and a second line, the two lines intersecting at right angles, a second region is defined by means of a third line which is an extension of the first line from a point of intersection of the first and second lines; a fourth line which is an extension of the second line from the point of intersection; and boundaries adjoining an embedded insulation film. No integrated circuits are formed in this second region. A contact penetrating through the second region is formed in the embedded insulation film, thus preventing an increase in the area of the semiconductor device.

In the semiconductor device according to the present invention, a potential supply pad is formed on the interlayer insulation film so as to be located outside the first region and receives steady potential. The wiring layer connects a power supply pad to an integrated circuit, thus making steady the potential of a semiconductor substrate by utilization of steady potential received from the outside.

The semiconductor device according to the present invention comprises a plurality of electrode pads, and a plurality of buffer circuits which are interposed between the electrode pads and an integrated circuit and arranged in a predetermined direction so as to oppose the electrode pads, thus eliminating a necessity for fabrication of buffer circuits in the region between the potential supply pad and the integrated circuit. A wiring layer comprises a portion opposite one of the plurality of buffer circuits and arranged in a predetermined direction, and a contact is provided below the opposing portion of the wiring layer, thus preventing an increase in the area of the semiconductor device.

In the semiconductor device according to the present invention, in a case where electrode pads for receiving steady potential and supplying the steady potential to an integrated circuit are formed on the interlayer insulation layer outside the region where the integrated circuit is fabricated, regions below the electrode pads are unassigned for fabrication of integrated circuits. A contact is formed so as to extend from below each of the electrode pads to the semiconductor substrate by penetrating through the embedded insulation film, thus preventing an increase in the area of the semiconductor device.

In the semiconductor device according to the present invention, a contact extending from the wiring layer to the semiconductor substrate by penetrating through the embedded insulation film adjoins, at one side thereof, a region which is to act as one terminal of a MOS transistor. Accordingly, when the same steady potential is supplied to the semiconductor substrate and one terminal of the MOS transistor, the contact is shared, with the result that the number of contacts can be diminished.

In the semiconductor device according to the present invention, the contact has a first plane adjoining the wiring layer, a second plane opposite the first plane and adjoining the semiconductor substrate, and a third plane adjoining a region which faces the first plane and serves as one terminal of the MOS transistor. As a result, the area of a contact plane between the contact and one terminal of the MOS transistor is increased, thereby establishing good electrical connection between the contact and one terminal of the MOS transistor.

In the semiconductor device according to the present invention, the circumferential surface of the contact is surrounded by and adjoins the region which is to act as one terminal of the MOS transistor. Accordingly, the area of a contact plane between the contact and one terminal of the MOS transistor is increased, thereby establishing good electrical connection between the contact and one terminal of the MOS transistor.

The region which is to serve as one terminal of the MOS transistor corresponds to a source region formed on the embedded insulation film, and steady potential is supplied to the source terminal of the MOS transistor.

The region which is to serve as one terminal of the MOS transistor corresponds to a contact region which is formed on the embedded insulation film and adjoins a body region sandwiched between the source and drain regions of the MOS transistor, so that steady potential is supplied to the body region.

Further, the region which is to serve as one terminal of the MOS transistor corresponds to a gate electrode of the MOS transistor, so that steady potential is supplied to the gate electrode.

The method of manufacturing a semiconductor device according to the present invention comprises a step of: forming an opening through use of etching such that the cross section of the opening is located on a boundary surface between the semiconductor layer and the insulation layer, thereby opening a portion of the semiconductor substrate and a portion of the semiconductor layer. Accordingly, a second opening can be formed through use of one type of etchant and a single mask. Through a process step of filling the inside of the second opening with a conductive substance, there is formed a contact for electrically connecting together the semiconductor layer and the semiconductor substrate. Accordingly, the process for forming the contact can be simplified, which in turn results in a reduction in manufacturing costs.

Further, the manufacturing method according to the present invention comprises a step of forming source and drain regions of the MOS transistor in the semiconductor layer, and the opening is formed in the source region. Consequently, there is provided a semiconductor device which electrically connects the source region to the semiconductor substrate.

Further, the manufacturing method comprises a step of forming in the semiconductor layer the source and drain regions of the MOS transistor, a body region to be sandwiched between the source and drain regions, and a contact region electrically connected to and adjoining the body region. The opening section is formed in the contact region, thereby yielding a semiconductor device comprising the body region electrically connected to the semiconductor substrate.

The manufacturing method of the present invention comprises a step of forming a gate electrode of the MOS transistor on the semiconductor layer such that one end of the gate electrode adjoins the upper surface of the insulation layer, and a step of forming an opening through use of etching such that the cross section of the opening is located at one end of the gate electrode, thereby opening a portion of the semiconductor substrate and a portion of the gate electrode. Therefore, a second opening can be formed through use of one type of etchant and a single mask.

Further, through a process of filling the inside of the opening with a conductive substance, there is formed a contact for electrically connecting together the gate electrode and the semiconductor substrate. Accordingly, the process for forming the contact becomes simpler, thereby enabling a reduction in manufacturing costs.

The method of manufacturing a wafer of SOI structure according to the present invention comprises a process step of implanting or diffusing semiconductor ions of the same conductivity as that of the first semiconductor wafer into the main surface of the first semiconductor wafer; and a process step of attaching together the surface of the second semiconductor wafer which is oxidized to a predetermined depth and the surface of the first semiconductor wafer, in which semiconductor ions are implanted or diffused. Accordingly, a high-impurity-concentration region can be formed on the surface of the semiconductor substrate adjoining the embedded insulation film without involvement of complicated control.

The method of manufacturing a wafer of SOI structure according to the present invention comprises process steps of: vapor-depositing metal on the main surface of the first semiconductor wafer; and attaching together the surface of the second semiconductor wafer which is oxidized to a predetermined depth and the surface of the first semiconductor wafer, in which semiconductor ions are implanted or diffused. Accordingly, a high-impurity-concentration region can be formed on the surface of the semiconductor substrate adjoining the embedded insulation film without involvement of complicated control.

In the semiconductor device, boundaries of the first region may comprise a first line and a second line, the two lines intersecting at right angles, and the contact penetrates to the semiconductor substrate through a second region defined by a third line which is an extension of the first line from a point of intersection of the first and second lines; a fourth line which is an extension of the second line from the point of intersection; and boundaries adjoining the embedded insulation film.

Here, the semiconductor device may further comprise a potential supply pad which is formed on the interlayer insulation film so as to be located outside the first region on the surface of the embedded insulation film and receives steady potential, wherein the wiring layer connects the potential supply pad to the integrated circuit.

Here, the semiconductor device may further comprise a plurality of electrode pads which are located outside the first region on the surface of the embedded insulation film and are arranged in a predetermined direction; and a plurality of buffer circuits which are formed in a region between the plurality of electrode pads and the first region and arranged in the predetermined direction in such a way as to oppose the respective electrode pads, wherein the steady potential pad is arranged in the predetermined direction together with the plurality of electrode pads, the wiring layer includes a opposing portion opposite to one of the plurality of buffer circuits arranged in the predetermined direction, the contact is formed below the opposing portion of the wiring layer.

In the semiconductor device, the contact may have a first plane adjoining the wiring layer, a second plane being opposite to the first plane and adjoining the semiconductor substrate, and a third plane which faces the first plane and adjoins a region serving as one terminal of the MOS transistor.

In the semiconductor device, the region serving as one terminal of the MOS transistor may be a source region formed on the embedded insulation film.

In the semiconductor device, the region serving as one terminal of the MOS transistor may be a contact region which is formed on the embedded insulation film and adjoins a body region sandwiched between the source region and the drain region of the MOS transistor.

In the semiconductor device, the region serving as one terminal of the MOS transistor may be a gate electrode of the MOS transistor.

In the semiconductor device, the contact may include a portion which is surrounded by and adjoins a region serving as one terminal of the MOS transistor in the circumferential surface.

In the semiconductor device, the contact may include a portion which is surrounded by the embedded insulation film in the circumferential surface.

In the semiconductor device, the contact may include a portion which is surrounded by an insulation layer in the circumferential surface, the insulation layer being formed between the embedded insulation film and the interlayer insulation film.

There is provided a method of manufacturing a semiconductor device from a wafer including a semiconductor substrate, an embedded insulation film formed on the main surface of the semiconductor substrate, and a semiconductor layer formed on the embedded insulation film, the method comprising the steps of: forming a first opening which opens the embedded insulation film by removing the semiconductor layer selectively; forming a insulation film in the first opening and on the semiconductor layer; forming an interlayer insulation film on the wafer; forming a second opening such that the cross section of the second opening is located on a boundary surface between the semiconductor layer and the insulation layer using etching, thereby opening a portion of the semiconductor substrate and a portion of the semiconductor layer; and filling the inside of the second opening with a conductive substance.

Here, the semiconductor device manufacturing method may further comprise a step of forming source region and drain region of a MOS transistor in the semiconductor layer; wherein the second opening makes an opening in the source region.

Here, the semiconductor device manufacturing method may further comprise a step of forming in the semiconductor layer the source region and drain region of the MOS transistor, a body region to be sandwiched between the source region and drain region, and a contact region electrically connected to the body region; wherein the second opening makes an opening in the contact region.

There is provided a method of manufacturing a semiconductor device including a semiconductor substrate, an embedded insulation film formed on the main surface of the semiconductor substrate, and a semiconductor layer formed on the embedded insulation film, the method comprising the steps of forming a first opening which opens the embedded insulation film by removing the semiconductor layer selectively; forming a insulation film in the first opening; forming a gate electrode of a MOS transistor on the semiconductor layer such that one end of the gate electrode adjoins the upper surface of the insulation layer; forming an interlayer insulation film on the wafer; forming a second opening such that the cross section of the second opening is located on one end of the gate electrode using etching, thereby opening a portion of the semiconductor substrate and a portion of the gate electrode; and filling the inside of the second opening with a conductive substance.

There is provided a method of manufacturing a wafer of SOI structure comprising the steps of: implanting or diffusing semiconductor ions of the same conductivity as that of a first semiconductor wafer into the main surface of the first semiconductor wafer; and attaching together the surface of the second semiconductor wafer which is oxidized to a predetermined depth and the surface of the first semiconductor wafer, in which semiconductor ions are implanted or diffused.

There is provided a method of manufacturing a wafer of SOI structure comprising the steps of: vapor-depositing metal on the main surface of a first semiconductor wafer; and attaching together the surface of a second semiconductor wafer which is oxidized to a predetermined depth and the surface of the first semiconductor wafer, in which semiconductor ions are implanted or diffused.

The present invention has been described in detail with respect to various embodiments, and it will now be apparent from the foregoing to those skilled in the art that changes and modifications may be made without departing from the invention in its broader aspects, and it is the invention, therefore, in the appended claims to cover all such changes and modifications as fall within the true spirit of the invention.

The entire disclosure of Japanese Patent Application No. 11-129467 filed on May 11, 1999 including specification, claims, drawings and summary are incorporated herein by reference in its entirety.

What is claimed is:

1. A semiconductor device comprising:
   a semiconductor substrate;
   an embedded insulation film formed on one main surface of said semiconductor substrate;
   an integrated circuit fabricated in a first region on the surface of said embedded insulation film;
   an interlayer insulation film formed on said embedded insulation film so as to cover said integrated circuit;
   a wiring layer formed in said interlayer insulation film and supplying steady potential;
   a contact extending from said wiring layer to said semiconductor substrate by penetrating through a portion, outside the first region and on the surface of said embedded insulating film, said contact establishing electrical connection between said wiring layer and said semiconductor substrate;
   a plurality of electrode pads which are located outside the first region on the surface of said embedded insulation film and are arranged in a predetermined direction;
   a plurality of buffer circuits which are formed in a region between said plurality of electrode pads and the first region and arranged in said predetermined direction in such a way as to oppose the respective electrode pads; and
   a potential supply pad which is formed on the interlayer insulation film so as to be located outside the first region on the surface of said embedded insulation film and receives steady potential,
   wherein said potential supply pad is arranged in said predetermined direction together with said plurality of electrode pads,
   said wiring layer includes an opposing portion opposite to one of said plurality of buffer circuits arranged in said predetermined direction and said wiring layer connects said potential supply pad to said integrated circuit, and
   said contact is formed below the opposing portion of said wiring layer.

2. The semiconductor device according to claim 1, wherein boundaries of the first region comprise a first line and a second line, the two lines intersecting at a right angle, and said contact penetrates to the semiconductor substrate through a second-region defined by a third line, a fourth line and an edge of said embedded insulation film, the third line being an extension of the first line from a point of the intersection of the first and second lines; the fourth line being an extension of the second line from the point of the intersection of the first and second lines.

3. A semiconductor device comprising:
   a semiconductor substrate;
   an embedded insulation film formed on one main surface of said semiconductor substrate;
   an integrated circuit fabricated on said embedded insulation film;
   an interlayer insulation film formed ,on said embedded insulation film so as to cover said integrated circuit;
   an electrode pad formed on said interlayer insulation film; and
   a contact from the lower surface of said electrode pad, said contact vertically extending directly beneath said electrode pad to said semiconductor substrate by penetrating through a portion of said embedded insulation film outside a region where said integrated circuit is fabricated, said contact establishing electrical connection between said semiconductor substrate and said electrode pad.

4. The semiconductor device according to claim 3, wherein said electrode pad adjoins a bonding wire for providing steady potential.

5. A semiconductor device comprising:
   a semiconductor substrate;
   an embedded insulation film formed on one main surface of said semiconductor substrate;
   a MOS transistor fabricated on the surface of said embedded insulation film;
   an interlayer insulation film formed so as to cover said MOS transistor;
   a wiring layer which is formed within said interlayer insulation film and supplies steady potential; and
   a contact having a portion which adjoins a region serving as one terminal of said MOS transistor at a side surface, said contact extending from said wiring layer to said semiconductor substrate by penetrating through said embedded insulation film, wherein said contact has a first plane adjoining said wiring layer, a second plane being opposite to the first plane and adjoining said semiconductor substrate, and a third plane which faces the first plane and adjoins a region serving as the one terminal of said MOS transistor.

6. The semiconductor device according to claim 5, wherein the region serving as one terminal of said MOS transistor is a source region formed on said embedded insulation film.

7. The semiconductor device according to claim 5, wherein the region serving as one terminal of said MOS transistor is a contact region which is formed on said embedded insulation film and adjoins a body region sandwiched between the source region and the drain region of said MOS transistor.

8. The semiconductor device according to claim 5, wherein the region serving as one terminal of said MOS transistor is a gate electrode of said MOS transistor.

9. A semiconductor device comprising:

a semiconductor substrate;

an embedded insulation film formed on one main surface of said semiconductor substrate;

a MOS transistor fabricated on the surface of said embedded insulation film;

an interlayer insulation film formed so as to cover said MOS transistor;

a wiring layer which is formed within said interlayer insulation film and supplies steady potential; and a contact having a portion which adjoins a region serving as one terminal of said MOS transistor at a side surface, said contact extending from said wiring layer to said semiconductor substrate by penetrating through said embedded insulation film, wherein the region serving as one terminal of said MOS transistor is a contact region which is formed on said embedded insulation film and adjoins a body region sandwiched between the source region and the drain region of said MOS transistor, said contact region being a semiconductor region having a same conductive type as that of said body region.

10. The semiconductor device according to claim 9, wherein said contact includes a portion which is surrounded by and adjoins the contact region.

11. A semiconductor device comprising:

a semiconductor substrate;

an embedded insulation film formed on one main surface of said semiconductor substrate;

a MOS transistor fabricated on the surface of said embedded insulation film;

an interlayer insulation film formed so as to cover said MOS transistor;

a wiring layer which is formed within said interlayer insulation film and supplies steady potential; and a contact having a portion which adjoins a region serving as one terminal of said MOS transistor at a side surface, said contact extending from said wiring layer to said semiconductor substrate by penetrating through said embedded insulation film, wherein the region serving as one terminal of said MOS transistor is a gate electrode of said MOS transistor.

12. The semiconductor device according to claim 11, wherein said contact includes a portion which is surrounded by an insulation layer in the circumferential surface, said insulation layer being formed between said embedded insulation film and said interlayer insulation film.

13. The semiconductor device according to claim 11, wherein said contact includes a portion which is surrounded by an insulation layer in the circumferential surface, said insulation layer being formed between said embedded insulation film and said interlayer insulation film.

14. The semiconductor device according to claim 11, wherein said contact includes a portion which is surrounded by and adjoins the gate region of said MOS transistor.

* * * * *